US006928605B2

(12) United States Patent
Sheaffer

(10) Patent No.: US 6,928,605 B2
(45) Date of Patent: Aug. 9, 2005

(54) ADD-COMPARE-SELECT ACCELERATOR USING PRE-COMPARE-SELECT-ADD OPERATION

(75) Inventor: Gad S. Sheaffer, Haifa (IL)

(73) Assignee: Intel Corporation, Santa Clara, CA (US)

(*) Notice: Subject to any disclaimer, the term of this patent is extended or adjusted under 35 U.S.C. 154(b) by 565 days.

(21) Appl. No.: 10/112,969

(22) Filed: Mar. 29, 2002

(65) Prior Publication Data

US 2003/0188244 A1 Oct. 2, 2003

(51) Int. Cl.[7] .............................................. H03M 13/03
(52) U.S. Cl. ...................................... 714/795; 714/797
(58) Field of Search ................................ 714/746, 795, 714/735, 797; 375/341; 326/113

(56) References Cited

U.S. PATENT DOCUMENTS

| | | | | |
|---|---|---|---|---|
| 5,418,795 A | * | 5/1995 | Itakura et al. .............. | 714/746 |
| 5,459,798 A | | 10/1995 | Bailey et al. | |
| 5,560,039 A | | 9/1996 | Dulong | |
| 5,638,408 A | * | 6/1997 | Takaki ........................ | 375/341 |
| 5,717,908 A | | 2/1998 | Dulong | |
| 5,752,001 A | | 5/1998 | Dulong | |
| 5,825,921 A | | 10/1998 | Dulong | |
| 5,881,312 A | | 3/1999 | Dulong | |
| 5,907,842 A | | 5/1999 | Mennemeier et al. | |
| 6,128,614 A | | 10/2000 | Mennemeier et al. | |
| 6,255,856 B1 | * | 7/2001 | Oh .............................. | 326/113 |
| 6,324,226 B1 | * | 11/2001 | Sasagawa .................... | 375/341 |
| 6,408,420 B1 | * | 6/2002 | Todoroki ..................... | 714/795 |

OTHER PUBLICATIONS

Forward Error Correction Encoding and Decoding, Intel Application Note 108, Techical Staff, May 1990, ppgs. 1–8.
Henry Hendrix, Viterbi Decoding Techniques in the TMS320C54x Family, SPRA071, Texas Instruments, Jun. 1996.
Carmel DSP Application Library, Infineon Technologies, Aug. 2000.
Sklar, Bernard, Digital Communications Fundamentals and Applications, 1988, ppgs. 314–380, Englewood Cliffs, New Jersey.
Gibson, Jerry D., Principles and Analog Communications, 1989, ppgs. 420–471, New York.

* cited by examiner

Primary Examiner—David Ton
(74) Attorney, Agent, or Firm—Blakely, Sokoloff, Taylor & Zafman LLP

(57) ABSTRACT

How a first result of a first operation compares to a second result of a second operation is identified. The identification may be performed without producing the first result or the second result. The first result or the second result may be selected in response to the identification, and the first operation or the second operation may be performed in response to the selection to produce the selected result. Alternatively, the first operation may be performed to produce the first result and the second operation may be performed to produce the second result. The produced first result or the produced second result may be selected in response to the identification.

23 Claims, 11 Drawing Sheets

ADD-COMPARE-SELECT ACCELERATOR USING PRE-COMPARE-SELECT-ADD OPERATION

BACKGROUND

1. Technical Field

One or more embodiments of the present invention relate generally to the field of computer systems. More particularly, one or more embodiments of the present invention relate to the field of add-compare-select operations performed by computer systems.

2. Description of Related Art

To address the needs of multi-media, communications, and graphics applications, computer systems have been designed to support one or more digital signal processing techniques to process, for example, analog data, video data, and/or audio data. Pattern recognition is one digital signal processing technique that may be used, for example, for error correction in communications applications, for image recognition applications, for speech recognition applications, and for handwriting recognition applications. Digital signal processing techniques typically use sophisticated algorithms that perform the same operations, such as an add-compare-select operation for example, on a relatively large number of data in units of bytes, words, or doublewords, for example.

A typical computer system supports add-compare-select operations with multiple instructions and one or more arithmetic logic units. As one example, the Intel® 32-bit Architecture as defined by Intel® Corporation of Santa Clara, Calif. supports add-compare-select operations with various instructions to add packed data and with various instructions to compare packed data.

BRIEF DESCRIPTION OF THE DRAWINGS

One or more embodiments of the present invention are illustrated by way of example and not limitation in the figures of the accompanying drawings, in which like references indicate similar elements and in which.

DETAILED DESCRIPTION

The following detailed description sets forth an embodiment or embodiments in accordance with the present invention for add-compare-select (ACS) accelerator using pre-compare-select-add (PCSA) operation. In the following description, details are set forth such as specific processor architectures, circuitry, etc., in order to provide a thorough understanding of one or more embodiments of the present invention. It will be evident, however, that one or more embodiments of the present invention may be practiced without these details. In other instances, well-known computer components, etc., have not been described in particular detail so as not to obscure this description.

Exemplary Computer System

Figure 1:
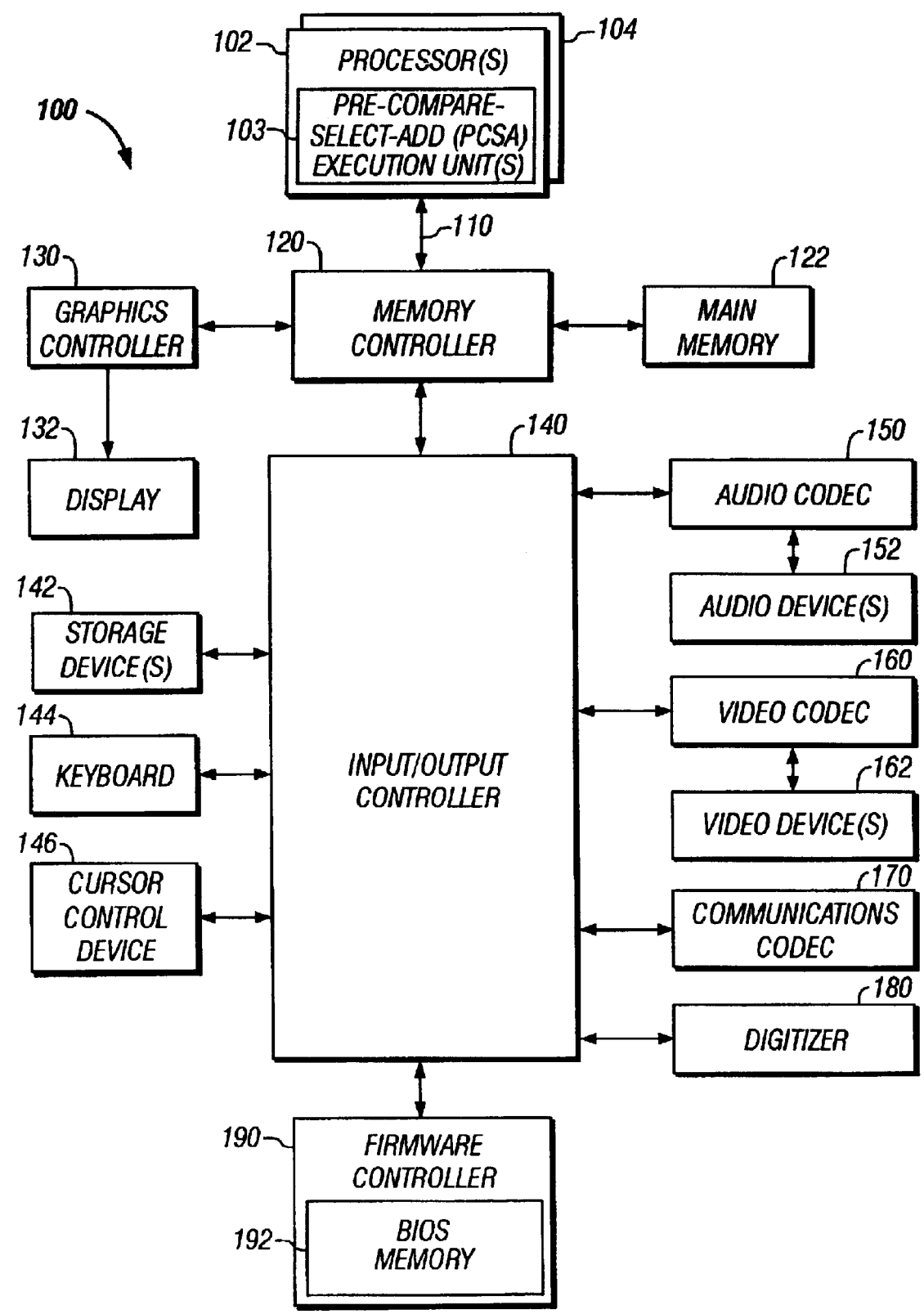
FIG. 1 illustrates an exemplary computer system comprising a processor having one or more pre-compare-select-add (PCSA) execution units.

FIG. 1 illustrates an exemplary computer system 100 comprising a processor 102 having one or more pre-compare-select-add (PCSA) execution units 103. Although described in the context of computer system 100, one or more PCSA execution units 103 may be used with any suitable computer system comprising any suitable one or more devices. Suitable computer systems include, without limitation, personal desktop and notebook computer systems, tablet computer systems, digital cellular telephone systems, and personal digital assistants (PDAs), for example.

As illustrated in FIG. 1, computer system 100 comprises another processor 104 that may also have one or more PCSA execution units. Processors 102 and 104 may each comprise any suitable processor architecture such as, for example, the Intel® 32-bit Architecture or the Intel® 64-bit Architecture as defined by Intel® Corporation of Santa Clara, Calif. Although described in the context of two processors 102 and 104, computer system 100 for other embodiments may comprise one, three, or more processors any of which may comprise one or more PCSA execution units.

Computer system 100 also comprises a memory controller 120. Processors 102 and 104 and memory controller 120 for one embodiment are each coupled to one another by a processor bus 110. Memory controller 120 may comprise any suitable circuitry formed on any suitable one or more integrated circuit chips.

Memory controller 120 may comprise any suitable interface controllers to provide for any suitable communication link to processor bus 110 and/or to any suitable device in communication with memory controller 120. Memory controller 120 for one embodiment may provide suitable arbitration, buffering, and coherency management for each interface.

Memory controller 120 provides an interface to processor 102 and/or processor 104 over processor bus 110. For one embodiment, processor 102 or 104 may alternatively be combined with memory controller 120 to form a single integrated circuit chip. Memory controller 120 for one embodiment also provides an interface to a main memory 122, a graphics controller 130, and an input/output (I/O) controller 140.

Main memory 122 is coupled to memory controller 120 to load and store data and/or instructions, for example, for computer system 100. Main memory 122 may comprise any suitable memory, such as suitable dynamic random access memory (DRAM) for example.

Graphics controller 130 is coupled to memory controller 120 to control the display of information on a suitable display 132, such as a cathode ray tube (CRT) or liquid crystal display (LCD) for example, coupled to graphics controller 130. Memory controller 120 for one embodiment interfaces with graphics controller 130 through an accelerated graphics port (AGP). Graphics controller 130 for one embodiment may alternatively be combined with memory controller 120 to form a single integrated circuit chip.

I/O controller 140 is coupled to memory controller 120 to provide an interface to one or more I/O devices coupled to I/O controller 140. I/O controller 140 may comprise any suitable interface controllers to provide for any suitable communication link to memory controller 120 and/or to any suitable device in communication with I/O controller 140. I/O controller 140 for one embodiment may provide suitable arbitration and buffering for each interface.

For one embodiment, I/O controller 140 may provide an interface to one or more storage devices 142, such as a hard disk drive (HDD), a floppy disk drive, a compact disc (CD) drive, and/or a digital versatile disc (DVD) drive, for example, to store data and/or instructions, for example. I/O controller 140 for one embodiment may also provide an interface to a keyboard 144 and a cursor control device 146, such as a mouse, joystick, or touch tablet for example.

I/O controller 140 for one embodiment may provide an interface to an audio coder/decoder (codec) 150 to convert received analog audio signals output from one or more suitable audio devices 152 into corresponding digital audio signals and/or to convert digital audio signals into corresponding analog audio signals for output to audio device(s) 152. Audio device(s) 152 may include, for example, one or more microphones and/or speakers for example.

I/O controller 140 for one embodiment may provide an interface to a video codec 160 to convert received analog video signals output from one or more suitable video devices 162 into corresponding digital video signals and/or to convert digital video signals into corresponding analog video signals for output to video device(s) 162. Video device(s) 162 may include, for example, a video camcorder and/or a video cassette recorder (VCR) for example.

I/O controller 140 for one embodiment may provide an interface to a communications codec 170 to convert analog signals received from one or more other computer systems over one or more networks, including the Internet for example, into corresponding digital signals and/or to convert digital signals into analog signals for transmission to one or more other computer systems over one or more networks, including the Internet for example. Communications codec 170 for one embodiment may comprise, for example, a modem codec or a radio frequency interface.

I/O controller 140 for one embodiment may provide an interface to a digitizer 180 to convert one-dimensional, two-dimensional, or three-dimensional movement of a stylus, for example, into corresponding digital signals. Digitizer 180 for one embodiment may comprise, for example, a tablet digitizer.

I/O controller 140 is also coupled to a firmware controller 190 to provide an interface to firmware controller 190. Firmware controller 190 comprises a basic input/output system (BIOS) memory 192 to store suitable system and/or video BIOS software. BIOS memory 192 may comprise any suitable non-volatile memory, such as a flash memory for example.

Processor Comprising PCSA Execution Unit(s)

Processor 102 comprises one or more pre-compare-select-add (PCSA) execution units 103 to help accelerate the performance of add-compare-select operations. Processor 102 for one embodiment may use one or more PCSA execution units 103 in performing digital signal processing, for example, on digital signals stored on storage device(s) 142, stored in main memory 122, and/or received through audio codec 150, video codec 160, communications codec 170, and/or digitizer 180, for example.

Figure 2:
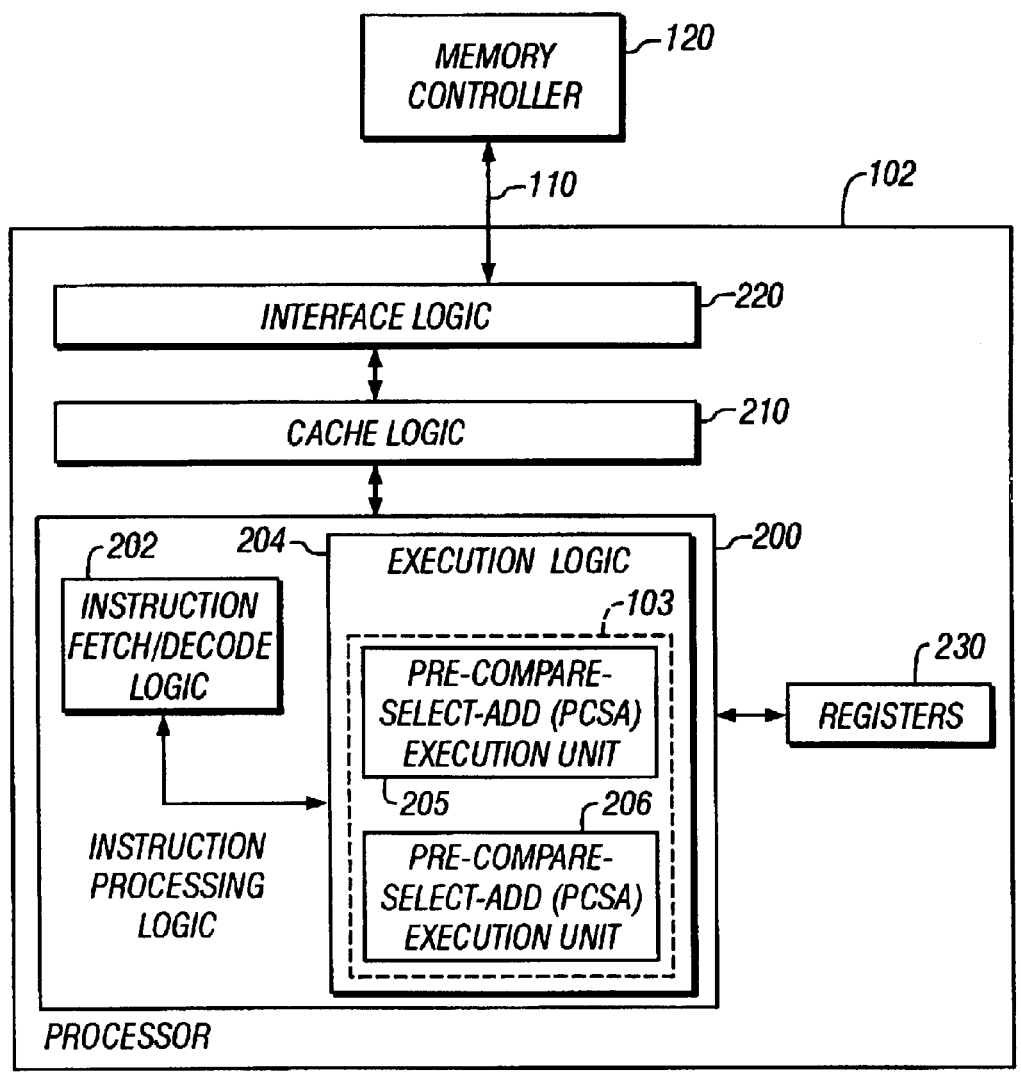
FIG. 2 illustrates, for one embodiment, a processor having one or more PCSA execution units.

As illustrated in FIG. 2, processor 102 for one embodiment comprises instruction processing logic 200, cache logic 210, interface logic 220, and registers 230. Interface logic 220 couples cache logic 210 to processor bus 110 and may comprise any suitable circuitry. Cache logic 210 and registers 230 are coupled to instruction processing logic 200.

Cache logic 210 helps supply instructions and/or data to instruction processing logic 200. Cache logic 210 may store instructions and/or data accessed from main memory 122 through interface logic 220 and memory controller 120 for processing by instruction processing logic 200. Cache logic 210 may also store recently and/or frequently used instructions and/or data to help minimize accesses to main memory 122.

Cache logic 210 may comprise any suitable circuitry. Cache logic 210 for one embodiment may implement a two cache level memory subsystem in which cache memory at a primary cache level is relatively small in size and closely coupled to instruction processing logic 200 to facilitate relatively quicker access of instructions and/or data stored at the primary cache level while cache memory at a secondary cache level stores relatively more instructions and/or data yet has a relatively slower access time. Cache logic 210 for one embodiment may implement a dedicated instruction cache memory portion and a separate dedicated data cache memory portion at the primary cache level. Cache logic 210 for other embodiments may implement one, three, or more cache levels. Cache logic 210 may store instructions and/or data for instruction processing logic 200 in accordance with any suitable caching scheme.

Instruction processing logic 200 may comprise any suitable circuitry to fetch and process instructions and/or data. Instruction processing logic 200 for one embodiment, as illustrated in FIG. 2, comprises an instruction pipeline comprising instruction fetch/decode logic 202 and execution logic 204 coupled to instruction fetch/decode logic 202.

Instruction fetch/decode logic 202 fetches instructions from cache logic 210. Instruction fetch/decode logic 202 may comprise any suitable circuitry to fetch instructions in any suitable manner. Instruction fetch/decode logic 202 for one embodiment may identify a next instruction to be fetched by instruction processing logic 200 in accordance with an instruction pointer maintained by instruction fetch/decode logic 202 and may request the instruction from cache logic 210. Cache logic 210 may identify whether the requested instruction is stored in cache memory and, if not, may request the instruction from main memory 122 through interface logic 220 and memory controller 120. Instruction fetch/decode logic 202 may identify the next instruction, for example, as the next sequential instruction in a program, as a predicted or actual destination of a branch instruction, or as the start of a new routine, such as an exception handling routine for example.

Instruction fetch/decode logic 202 for one embodiment may decode each instruction into one or more micro-operations. Instruction fetch/decode logic 202 for one embodiment may decode each instruction into one or more triadic micro-operations. A triadic micro-operation comprises an operation code or opcode and may comprise up to two logical source operands and one logical destination operand.

Execution logic 204 executes the micro-operations generated by instruction fetch/decode logic 202. Execution logic 204 may comprise any suitable circuitry and for one embodiment comprises a plurality of execution units including one or more pre-compare-select-add (PCSA) execution units 103. As illustrated in FIG. 2, execution logic 204 for one embodiment may comprise two PCSA execution units 205 and 206. For other embodiments, execution logic 204 may comprise one, three, or more PCSA execution units. Execution logic 204 for one embodiment may also comprise one or more integer execution units, one or more floating point execution units, and/or a memory interface execution unit for example. Execution logic 204 may dispatch each micro-operation to an appropriate execution unit available to execute the micro-operation.

Execution logic 204 for one embodiment executes one or more memory load micro-operations by dispatching the memory load micro-operation to a memory interface execution unit coupled to cache logic 210 to request data from cache memory or main memory 122. Execution logic 204 may then store the requested data in one or more registers of registers 230 or may allow access to the requested data through one or more memory ports for use by any execution unit in executing a micro-operation.

Execution logic 204 for one embodiment may execute micro-operations in the order they are generated by instruction fetch/decode logic 202. Execution logic 204 for another embodiment may comprise suitable circuitry to execute micro-operations out-of-order to help increase instruction throughput.

Although described in the context of instruction processing logic 200 as illustrated in FIG. 2, one or more PCSA execution units 103 may be implemented using any suitable processor architecture. As one example, instruction fetch/decode logic 202 for another embodiment may not decode one or more fetched instructions into micro-operations but rather may process each instruction for execution directly. As another example, one or more PCSA execution units 103 may be implemented with any suitable digital signal processor (DSP) architecture.

Figure 3:
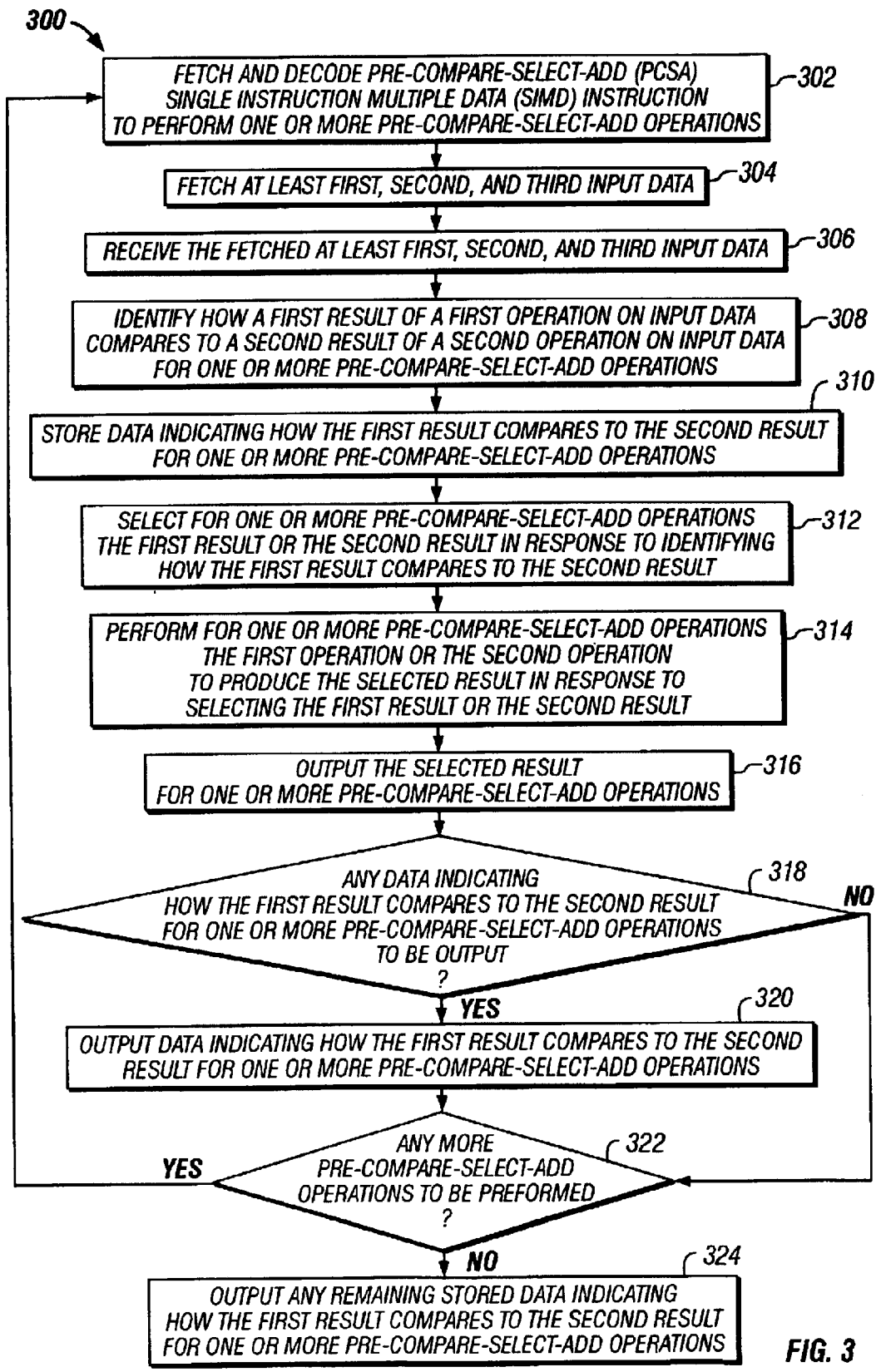
FIG. 3 illustrates, for one embodiment, a flow diagram to perform one or more pre-compare-select-add operations.

Flow Diagram 300 of FIG. 3

Instruction processing logic 200 may perform one or more pre-compare-select-add operations using one or more PCSA execution units 103 in any suitable manner. Instruction processing logic 200 for one embodiment may perform one or more pre-compare-select-add operations in accordance with a flow diagram 300 as illustrated in FIG. 3. Although flow diagram 300 is described in connection with PCSA execution unit 205, any one or more PCSA execution units 103, such as PCSA execution unit 206 for example, may be used to perform one or more pre-compare-select-add operations in accordance with flow diagram 300.

For block 302 of FIG. 3, instruction fetch/decode logic 202 fetches and decodes a pre-compare-select-add (PCSA) single instruction multiple data (SIMD) instruction to perform one or more pre-compare-select-add operations. The PCSA SIMD instruction may have any suitable format.

For block 304, execution logic 204 fetches at least first, second, and third input data. Execution logic 204 for one embodiment may fetch the at least first, second, and third input data in response to the PCSA SIMD instruction. Execution logic 204 for one embodiment may request any of the at least first, second, and third input data from cache logic 210. Execution logic 204 may then allow access to the requested input data from PCSA execution unit 205 through one or more memory ports or may store the requested input data in one or more registers of registers 230 and allow access to the requested input data from PCSA execution unit 205 through one or more register ports. Execution logic 204 for one embodiment may read any of the at least first, second, and third input data already loaded in registers 230 from registers 230. The fetched input data may have any suitable size and may be stored in any suitable format. For one embodiment, the fetched first, second, and third input data may be 16 bits in size. The fetched input data for one embodiment may be in a packed format. In this manner, more than one input data may be made available for access for PCSA execution unit 205 through one memory or register port.

For block 306, PCSA execution unit 205 receives the fetched at least first, second, and third input data and for blocks 308, 310, 312, and 314 performs one or more pre-compare-select-add operations on the received input data. PCSA execution unit 205 for one embodiment may receive the fetched at least first, second, and third input data and perform one or more pre-compare-select-add operations on the received input data in response to the PCSA SIMD instruction. A pre-compare-select-add operation comprises identifying how a first result of a first operation on at least two input data compares to a second result of a second operation on at least two input data, selecting an operation or result in response to the comparison, and performing the selected operation to produce the selected result.

PCSA execution unit 205 may support any suitable type or types of first and second operations. PCSA execution unit 205 for one embodiment may support one or more arithmetic operations on input data. As one example, PCSA execution unit 205 may support addition for the first and second operations on input data. Although described as a pre-compare-select-add execution unit to perform one or more pre-compare-select-add operations, PCSA execution unit 205 may also or alternatively support subtraction, multiplication, and/or division, for example, for the first and/or second operations on input data. PCSA execution unit 205 for one embodiment may support addition and subtraction for the first operation and addition and subtraction for the second operation.

PCSA execution unit 205 for one embodiment may at least partially overlap the performance of multiple pre-compare-select-add operations in time. PCSA execution unit 205 for one embodiment may perform multiple pre-compare-select-add operations on received input data in parallel. PCSA execution unit 205 for one embodiment may perform multiple pre-compare-select-add operations on the same input data and at least partially overlap such performance in time. PCSA execution unit 205 for one embodiment may perform two pre-compare-select-add operations on the received first, second, and third input data. PCSA execution unit 205 for one embodiment may also perform one or more pre-compare-select-add operations on fetched and received fourth, fifth, and sixth input data in an at least partially overlapped manner in time with the performance of one or more pre-compare-select-add operations on the received first, second, and third input data.

For block 308, PCSA execution unit 205 identifies how a first result of a first operation on input data compares to a second result of a second operation on input data for one or more pre-compare-select-add operations. PCSA execution unit 205 may identify how the first and second results compare in any suitable manner.

PCSA execution unit 205 for one embodiment may identify whether the first result, for example, is greater than or equal to the second result, for example. PCSA execution unit 205 for one embodiment may identify how the first and second results compare by performing arithmetic operations on input data to identify whether the difference between the first and second results is positive or zero or is negative. That is, PCSA execution unit 205 for one embodiment may perform operations that effectively subtract the second operation from the first operation. In this manner, PCSA execution unit 205 may identify how the first and second results compare without determining the first and second results and without directly comparing the first and second results. PCSA execution unit 205 for another embodiment may identify whether the second result, for example, is less than or equal to the first result, for example.

As one example, PCSA execution unit 205 for one embodiment may identify for a pre-compare-select-add operation whether a first result $r_1$ of an addition operation on first input data $i_1$ and third input data $i_3$ is greater than or equal to a second result $r_2$ of a subtraction operation on second input data $i_2$ and third input data $i_3$. PCSA execution unit 205 may identify whether $r_1=i_1+i_3 \geq r_2=i_2-i_3$ by performing $(i_1+i_3)-(i_2-i_3)$ or $i_1-i_2+2*i_3$ and identifying whether the results is positive or zero, indicating $r_1 \geq r_2$, or is negative, indicating $r_1 < r_2$.

For block 310, PCSA execution unit 205 may optionally store data indicating how the first result compares to the second result for one or more pre-compare-select-add operations. PCSA execution unit 205 may store any suitable data in any suitable manner for any suitable purpose.

For blocks 312 and 314, PCSA execution unit 205 selectively performs for one or more pre-compare-select-add operations the first operation or the second operation to produce a selected result in response to identifying how the first result compares to the second result. By selectively performing the first operation or the second operation, PCSA execution unit 205 performs only one operation to produce a selected result for a pre-compare-select-add operation.

For block 312, PCSA execution unit 205 selects for one or more pre-compare-select-add operations the first result or the second result in response to identifying how the first result compares to the second result. PCSA execution unit 205 may select the first result or the second result in any suitable manner. For one embodiment where PCSA execution unit 205 identifies whether the first result, for example, is greater than or equal to the second result, for example, PCSA execution unit 205 may select the first result, for example, if the first result is greater than or equal to the second result or may select the second result, for example, if the first result is less than the second result.

For block 314, PCSA execution unit 205 performs for one or more pre-compare-select-add operations the first operation or the second operation to produce the selected result in response to selecting the first result or the second result. PCSA execution unit 205 may perform the first operation or the second operation to produce the selected result in any suitable manner.

As one example where PCSA execution unit 205 for block 308 may identify for a pre-compare-select-add operation whether a first result $r_1$ of an addition operation on first input data $i_1$ and third input data $i_3$ is greater than or equal to a second result $r_2$ of a subtraction operation on second input data $i_2$ and third input data $i_3$, PCSA execution unit 205 for one embodiment may select for block 312 the first result $r_1$, for example, if PCSA execution unit 205 identifies the first result $r_1$ is greater than or equal to the second result $r_2$ and may perform for block 314 the first operation, that is $i_1+i_3$, to produce the first result $r_1$. If PCSA execution unit 205 identifies the first result $r_1$ is less than the second result $r_2$, PCSA execution unit 205 for one embodiment may then select for block 312 the second result $r_2$, for example, and may perform for block 314 the second operation, that is $i_2-i_3$, to produce the second result $r_2$.

For block 316, PCSA execution unit 205 outputs the selected result for one or more pre-compare-select-add operations. PCSA execution unit 205 for one embodiment may output the selected result for one or more pre-compare-select-add operations in response to the PCSA SIMD instruction. PCSA execution unit 205 for one embodiment may output the selected result for one or more pre-compare-select-add operations to one or more memory ports for storage in memory and/or to one or more register ports for storage in one or more registers 230. A selected result may have any suitable size and may be stored in any suitable format. For one embodiment, a selected result may be 16 bits in size. A selected result for one embodiment may be in a packed format. In this manner, more than one selected result may be output to one memory or register port.

If any data indicating how the first result compares to the second result for one or more pre-compare-select-add operations is to be output for block 318, PCSA execution unit 205 outputs such data for block 320. PCSA execution unit 205 may output such data in any suitable manner and in response to any suitable condition. Blocks 318 and 320 are optional.

PCSA execution unit 205 for one embodiment may output such data for each of one or more iterations of operations for blocks 302–316. PCSA execution unit 205 for another embodiment may output such data when PCSA execution unit 205 has stored a predetermined amount of such data. As one example, PCSA execution unit 205 may output such data when PCSA execution unit 205 has stored such data in repeating operations for blocks 302–316 a predetermined number of times.

PCSA execution unit 205 for one embodiment may output data for block 320 as PCSA execution unit 205 outputs the selected result for one or more pre-compare-select-add operations for block 316. PCSA execution unit 205 for one embodiment may output data for block 320 to one or more memory ports for storage in memory and/or to one or more register ports for storage in one or more registers 230. Such data may have any suitable size and may be stored in any suitable format. For one embodiment, such data may be output in one or more 32-bit portions.

PCSA execution unit 205 for one embodiment may output data for block 320 in response to the PCSA SIMD instruction. For another embodiment, instruction fetch/decode logic 202 may fetch and decode a PCSA read instruction to output such data from PCSA execution unit 205 and to store the output data to registers 230 and/or to memory. The PCSA read instruction may have any suitable format.

If any more pre-compare-select-add operations are to be performed for block 322, instruction processing logic 200 may then repeat operations for blocks 302–320. Otherwise, instruction processing logic 200 for block 324 may optionally output from PCSA execution unit 205 any remaining stored data indicating how the first result compares to the second result for one or more pre-compare-select-add operations. For one embodiment, instruction fetch/decode logic 202 may fetch and decode a PCSA read instruction to output such data from PCSA execution unit 205. The PCSA read instruction may have any suitable format. PCSA execution unit 205 for one embodiment may output data for block 324 to one or more memory ports for storage in memory and/or to one or more register ports for storage in one or more registers 230. Such data may have any suitable size and may be stored in any suitable format. For one embodiment, such data may be output in one or more 32-bit portions.

Instruction processing logic 200 may perform operations for blocks 302–324 in any suitable order and may or may not overlap in time the performance of any suitable operation with any other suitable operation. Instruction processing logic 200 for one embodiment may at least partially overlap in time the performance of suitable operations for any blocks 302–324 in a pipelined manner.

Instruction processing logic 200 for one embodiment may support saturation, precision adjustment, and/or data packing in performing one or more pre-compare-select-add operations in accordance with flow diagram 300.

Although described in the context of performing pre-compare-select-add operations using a SIMD technique, one or more PCSA execution units 103 for another embodiment may be controlled to perform one or more pre-compare-select-add operations in accordance with flow diagram 300 using any other suitable technique.

Each of one or more PCSA execution units 103, such as PCSA execution unit 205 and/or PCSA execution unit 206 for example, may have any suitable number of inputs to receive any suitable number of input data for block 306, may comprise any suitable circuitry to perform any suitable number of one or more pre-compare-select-add operations on input data for blocks 308, 310, 312, and 314, and may have any suitable number of outputs to output any suitable number of selected results for block 316 and/or data indicating how a first result compares to a second result for one or more pre-compare-select-add operations for blocks 320 and/or 324. One or more PCSA execution units of PCSA execution unit(s) 103 may or may not be implemented similarly.

Figure 4:
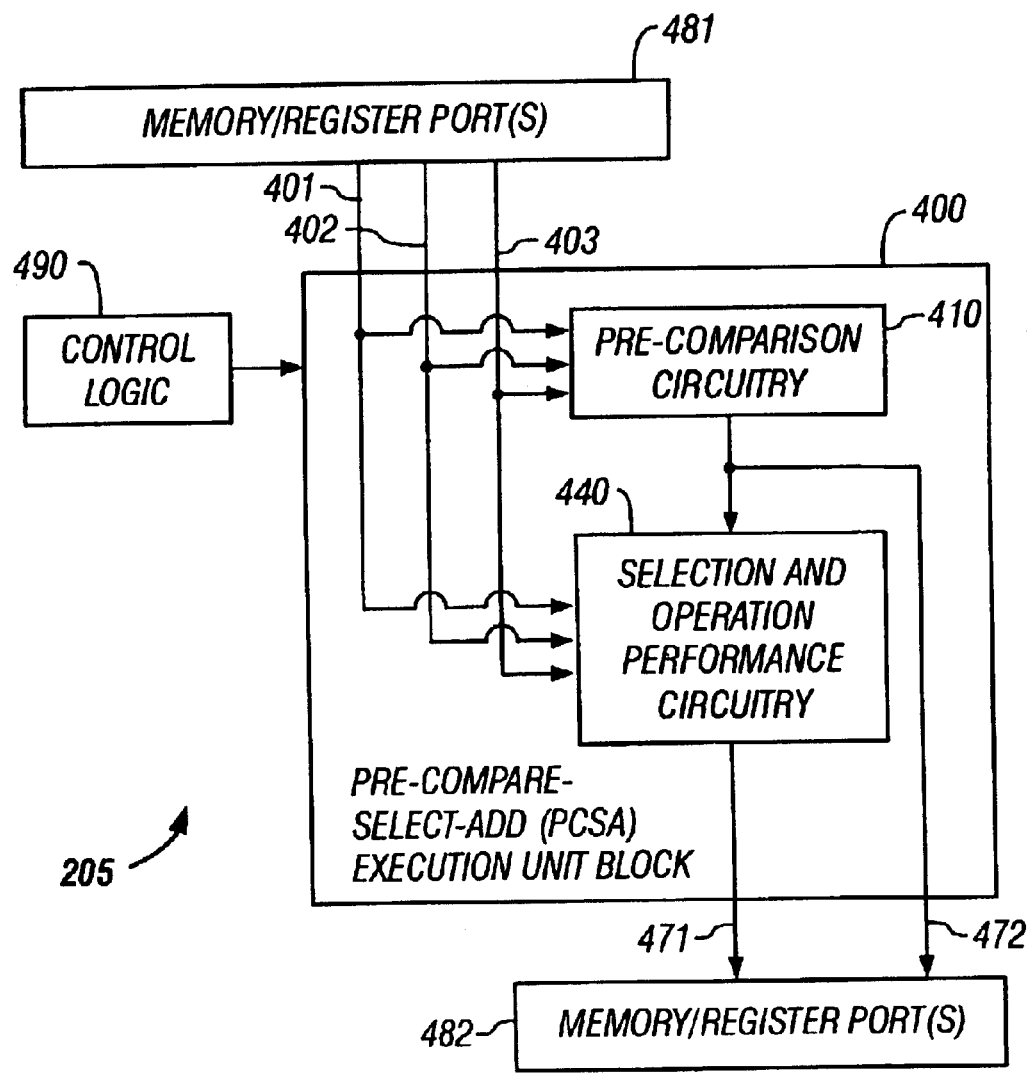
FIG. 4 illustrates, for one embodiment, a PCSA execution unit.

PCSA Execution Unit 205 of FIG. 4

PCSA execution unit 205 for one embodiment may comprise a PCSA execution unit block 400 and control logic 490 coupled to PCSA execution unit block 400, as illustrated in FIG. 4. PCSA execution unit block 400 has inputs 401, 402, and 403, has outputs 471 and 472, and comprises pre-comparison circuitry 410 and selection and operation performance circuitry 440.

Pre-comparison circuitry 410 is coupled to inputs 401, 402, and 403 and has an output coupled to selection and operation performance circuitry 440 and to output 472. Control logic 490 for one embodiment may control pre-comparison circuitry 410 for block 306 of FIG. 3 to receive first, second, and third input data at inputs 401, 402, and 403, respectively, from one or more memory and/or register ports 481 and for block 308 to identify how a first result of a first operation on input data compares to a second result of a second operation on input data for a pre-compare-select-add operation. Control logic 490 for one embodiment may control pre-comparison circuitry 410 for block 310 to store data indicating how the first result compares to the second result for one or more pre-compare-select-add operations. Control logic 490 for one embodiment may control pre-comparison circuitry 410 for blocks 320 and/or 324 to output to one or more memory and/or register ports 482 at output 472 data indicating how the first result compares to the second result for one or more pre-compare-select-add operations.

Selection and operation performance circuitry 440 is coupled to inputs 401, 402, and 403, to output 471, and to an output of pre-comparison circuitry 410. Control logic 490 for one embodiment may control selection and operation performance circuitry 440 to receive first, second, and third input data from inputs 401, 402, and 403, respectively, and to receive from pre-comparison circuitry 410 data indicating how a first result of a first operation on input data compares to a second result of a second operation on input data for a pre-compare-select-add operation. Control logic 490 for one embodiment may control selection and operation performance circuitry 440 for block 312 of FIG. 3 to select the first result or the second result based on the received data. Control logic 490 for one embodiment may control selection and operation performance circuitry 440 for block 314 to perform the first operation or the second operation to produce the selected result and for block 316 to output the selected result to one or more memory and/or register ports 482 at output 471.

PCSA execution unit block 400 may comprise any suitable circuitry for pre-comparison circuitry 410 and for selection and operation performance circuitry 440.

Figure 5:
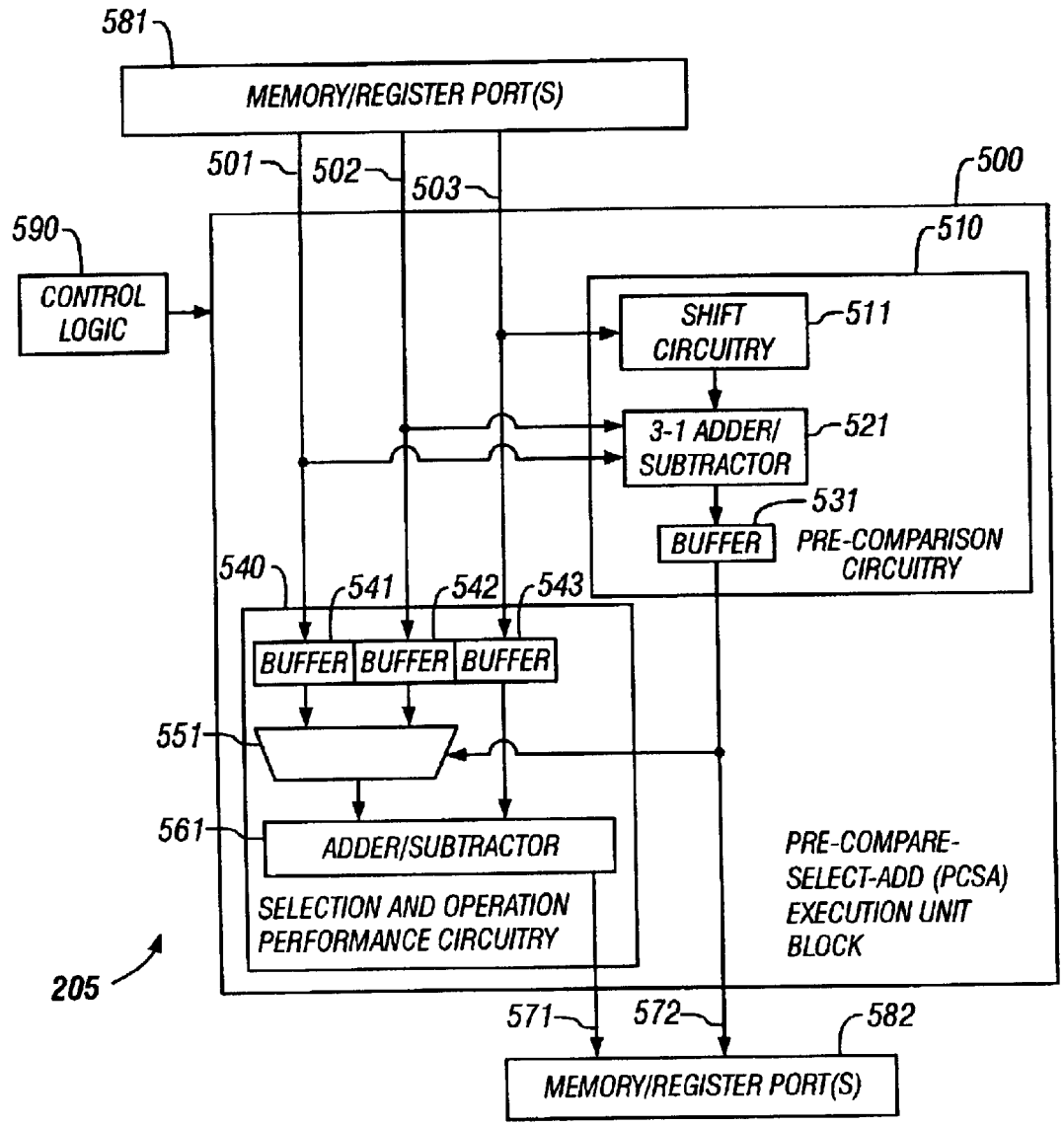
FIG. 5 illustrates, for one embodiment, pre-comparison circuitry and selection and operation performance circuitry for the PCSA execution unit of FIG. 4.

PCSA Execution Unit 205 of FIG. 5

PCSA execution unit 205 for one embodiment may comprise a PCSA execution unit block 500 and control logic 590 coupled to PCSA execution unit block 500, as illustrated in FIG. 5. PCSA execution unit block 500 has inputs 501, 502, and 503, has outputs 571 and 572, and comprises pre-comparison circuitry 510 and selection and operation performance circuitry 540.

Inputs 501, 502, and 503 generally correspond to inputs 401, 402, and 403, respectively, of FIG. 4. Outputs 571 and 572 generally correspond to outputs 471 and 472, respectively. Pre-comparison circuitry 510 and selection and operation performance circuitry 540 generally correspond to pre-comparison circuitry 410 and selection and operation performance circuitry 440, respectively. Memory/register port(s) 581 and 582 generally correspond to memory/register port(s) 481 and 482, respectively.

Pre-comparison circuitry 510 for one embodiment comprises shift circuitry 511, a 3-1adder/subtractor 521, and a buffer 531.

Shift circuitry 511 is coupled to input 503 and has an output coupled to 3-1 adder/subtractor 521. Control logic 590 for one embodiment may control shift circuitry 511 to shift bits of third input data at input 503 by a predetermined number of one or more bits relative to input lines for 3-1 adder/subtractor 521 to produce a multiple of the third input data. Control logic 590 for one embodiment may control shift circuitry 511 to shift third input data $i_3$ by one bit to produce $2*i_3$. Shift circuitry 511 may comprise any suitable circuitry to shift bits of the third input data in any suitable manner.

Shift circuitry 511 for one embodiment may comprise suitable circuitry to shift bits of third input data by a selective number of bits. In this manner, control logic 590 may control shift circuitry 511 to shift bits of third input data by zero bits or by one bit, for example.

Figure 6:
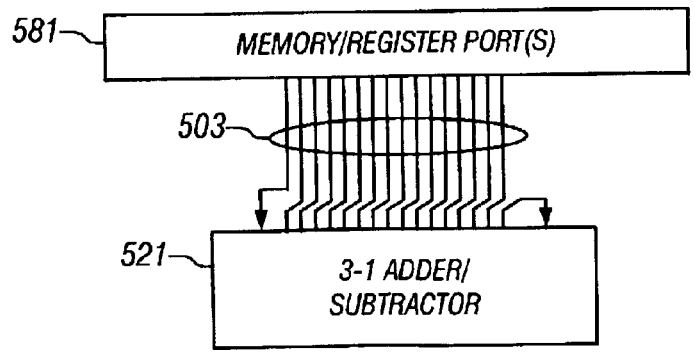
FIG. 6 illustrates, for one embodiment, shifted input lines for a 3-1 adder/subtractor for a PCSA execution unit.

Pre-comparison circuitry 510 for another embodiment may comprise shifted input lines to shift third input data by a predetermined number of one or more bits relative to input 503 for input to 3-1 adder/subtractor 521. FIG. 6 illustrates for one embodiment shifted input lines to shift third input data by one bit relative to input 503 for input to 3-1 adder/subtractor 521.

Pre-comparison circuitry 510 for one embodiment shifts third input data by n bit(s) to produce a $2^n$ multiple of the third input data for use to identify how a first result of a first operation on input data compares to a second result of a second operation on input data. Pre-comparison circuitry 510 for another embodiment may not shift third input data by any bits.

3-1 adder/subtractor 521 is coupled to inputs 501 and 502 and to an output of shift circuitry 511 and has an output coupled to buffer 531.

Control logic 590 for one embodiment may control 3-1 adder/subtractor 521 for block 306 of FIG. 3 to receive as inputs first input data, second input data, and shifted third input data.

Control logic 590 for one embodiment may control 3-1 adder/subtractor 521 for block 308 to identify how a first result of a first addition or subtraction operation on input data compares to a second result of a second addition or subtraction operation on input data for a pre-compare-select-add operation. Control logic 590 for one embodiment may control 3-1 adder/subtractor 521 to output to buffer 531 data indicating how the first result compares to the second result for the pre-compare-select-add operation.

As one example, control logic 590 for one embodiment may control 3-1 adder/subtractor 521 to identify whether a first result $r_1$ of an addition operation on first input data $i_1$ and third input data $i_3$ is greater than or equal to a second result $r_2$ of a subtraction operation on second input data $i_2$ and third input data $i_3$, that is whether $r_1 = i_1 + i_3 \geq r_2 = i_2 - i_3$, by determining the difference of the sum of the first and third input data minus the difference of the second input data minus the third input data, that is $(i_1+i_3)-(i_2-i_3)$, and identifying whether the result is positive or zero, indicating $r_1 \geq r_2$, or is negative, indicating $r_1 < r_2$. Control logic 590 for one embodiment may control 3-1 adder/subtractor 521 to perform $i_1 - i_2 + 2^* i_3$, which is equal to $(i_1+i_3)-(i_2-i_3)$, and to output to buffer 531 data, such as a single bit for example, indicating whether the result is positive or zero or is negative.

3-1 adder/subtractor 521 may comprise any suitable circuitry to perform addition or subtraction on input data of any suitable size. 3-1 adder/subtractor 521 for one embodiment may perform addition or subtraction on 16-bit input data, for example.

Control logic 590 for one embodiment may control buffer 531 for block 310 of FIG. 3 to receive and store data indicating how the first result compares to the second result. Control logic 590 for one embodiment may control buffer 531 to store such data for one or more pre-compare-select-add operations. Buffer 531 may comprise any suitable circuitry to store any suitable amount of data in any suitable manner. Buffer 531 for one embodiment may comprise a shift register that may store, for example, 16 or 32 bits.

Selection and operation performance circuitry 540 for one embodiment comprises buffers 541, 542, and 543, a multiplexer 551, and an adder/subtractor 561.

Buffers 541, 542, and 543 have inputs coupled to inputs 501, 502, and 503, respectively. Control logic 590 for one embodiment may control buffers 541, 542, and 543 to receive and store the first input data, the second input data, and the third input data, respectively. Buffers 541, 542, and 543 may comprise any suitable circuitry to store any suitable amount of data in any suitable manner. Buffers 541, 542, and 543 for one embodiment may be implemented using D-type flip-flops, for example, to store 16 bits, for example.

Multiplexer 551 has inputs coupled to outputs of buffers 531, 541, and 542 and has an output coupled to adder/subtractor 561. Control logic 590 for one embodiment may control buffers 541, 542, and 543 to output the stored first, second, and third input data, respectively, and may control multiplexer 551 to receive the stored first and second input data. Control logic 590 for one embodiment may control buffer 531 for block 312 of FIG. 3 to output stored data indicating how the first result compares to the second result for a pre-compare-select-add operation to control multiplexer 551 to output in a selective manner either the received first input data or the received second input data to adder/subtractor 561.

Adder/subtractor 561 has inputs coupled to the output of multiplexer 551 and to an output of buffer 543 and has an output coupled to output 571. Control logic 590 for one embodiment may control adder/subtractor 561 to receive as inputs the data selectively output from multiplexer 551 and the third input data stored in buffer 543.

Control logic 590 for one embodiment may control adder/subtractor 561 for block 314 to perform an addition or subtraction operation on input data to produce either the first or second result for a pre-compare-select-add operation depending on how the first result compares to the second result. Control logic 590 for one embodiment may control adder/subtractor 561 for block 316 to output the produced first or second result for a pre-compare-select-add operation at output 571 to one or more memory and/or register ports 582.

As one example where control logic 590 may control 3-1 adder/subtractor 521 to identify whether a first result $r_1$ of an addition operation on first input data $i_1$ and third input data $i_3$ is greater than or equal to a second result $r_2$ of a subtraction operation on second input data $i_2$ and third input data $i_3$, control logic 590 for one embodiment may control multiplexer 551 to output first input data $i_1$, for example, if 3-1 adder/subtractor 521 identifies the first result $r_1$ is greater than or equal to the second result $r_2$ and may then control adder/subtractor 561 to perform the first operation, that is $i_1+i_3$, to produce the first result $r_1$. If 3-1 adder/subtractor 521 identifies the first result $r_1$ is less than the second result $r_2$, control logic 590 for one embodiment may control multiplexer 551 to output second input data $i_2$, for example, and may then control adder/subtractor 561 to perform the second operation, that is $i_2-i_3$, to produce the second result $r_2$.

Control logic 590 may control adder-subtractor 561 to perform an addition or subtraction operation on input data in any suitable manner. For one embodiment where the first and second operations for a pre-compare-select-add operation are different, adder-subtractor 561 may be coupled to receive from buffer 531 data indicating how the first result compares to the second result for the pre-compare-select-add operation to control adder/subtractor 561 to perform in a selective manner either the first operation or the second operation. For another embodiment where the first and second operations for a pre-compare-select-add operation are different, control logic 590 may be coupled to receive from 3-1 adder/subtractor 521 or from buffer 531 data indicating how the first result compares to the second result for the pre-compare-select-add operation to control adder/subtractor 561 to perform in a selective manner either the first operation or the second operation.

Adder/subtractor 561 may comprise any suitable circuitry to perform addition or subtraction on input data of any suitable size. Adder/subtractor 561 for one embodiment may perform addition or subtraction on 16-bit input data, for example. Adder/subtractor 561 for one embodiment may also perform saturation and/or merging operations.

Buffer 531 has an output coupled to output 572. Control logic 590 for one embodiment may control buffer 531 for blocks 320 and/or 324 to output data stored in buffer 531 at output 572 to one or more memory and/or register ports 582. Control logic 590 for one embodiment may control buffer 531 to output data as adder/subtractor 561 outputs data. Control logic 590 for one embodiment may control buffer 531 to output data when buffer 531 has stored a predetermined amount of data.

Control logic 590 for one embodiment may control PCSA execution unit block 500 to perform pre-compare-select-add operations in a pipelined manner.

Control logic 590 for one embodiment may control shift circuitry 511 to shift input data, may control 3-1 adder/subtractor 521 to receive input data and identify how a first result of a first addition or subtraction operation on input data compares to a second result of a second addition or subtraction operation on input data, may control buffer 531 to receive and store data output from 3-1 adder/subtractor 521, and may control buffers 541, 542, and 543 to receive and store input data during a first computation cycle for a first pre-compare-select-add operation.

Control logic 590 for one embodiment may control buffer 531 to output stored data to control multiplexer 551, may control buffers 541, 542, and 543 to output stored data, may control multiplexer 551 to receive stored data from buffers 541 and 542 and to output data in a selective manner to adder/subtractor 561, and may control adder/subtractor 561 to receive input data from multiplexer 551 and buffer 543, to perform an addition or subtraction operation on input data to produce either the first or second result, and to output the produced result during a second computation cycle for the first pre-compare-select-add operation.

Control logic 590 for one embodiment may control PCSA execution unit block 500 to overlap in time the performance of the first computation cycle for a second pre-compare-select-add operation with the performance of the second computation cycle for the first pre-compare-select-add operation. Control logic 590 for one embodiment may then control PCSA execution unit block 500 to receive new input data for a new pre-compare-select-add operation for each of multiple consecutive computation cycles and, after an initial one computation cycle latency period, to output a selected result for a completed pre-compare-select-add operation for each of multiple consecutive computation cycles.

Figure 7:
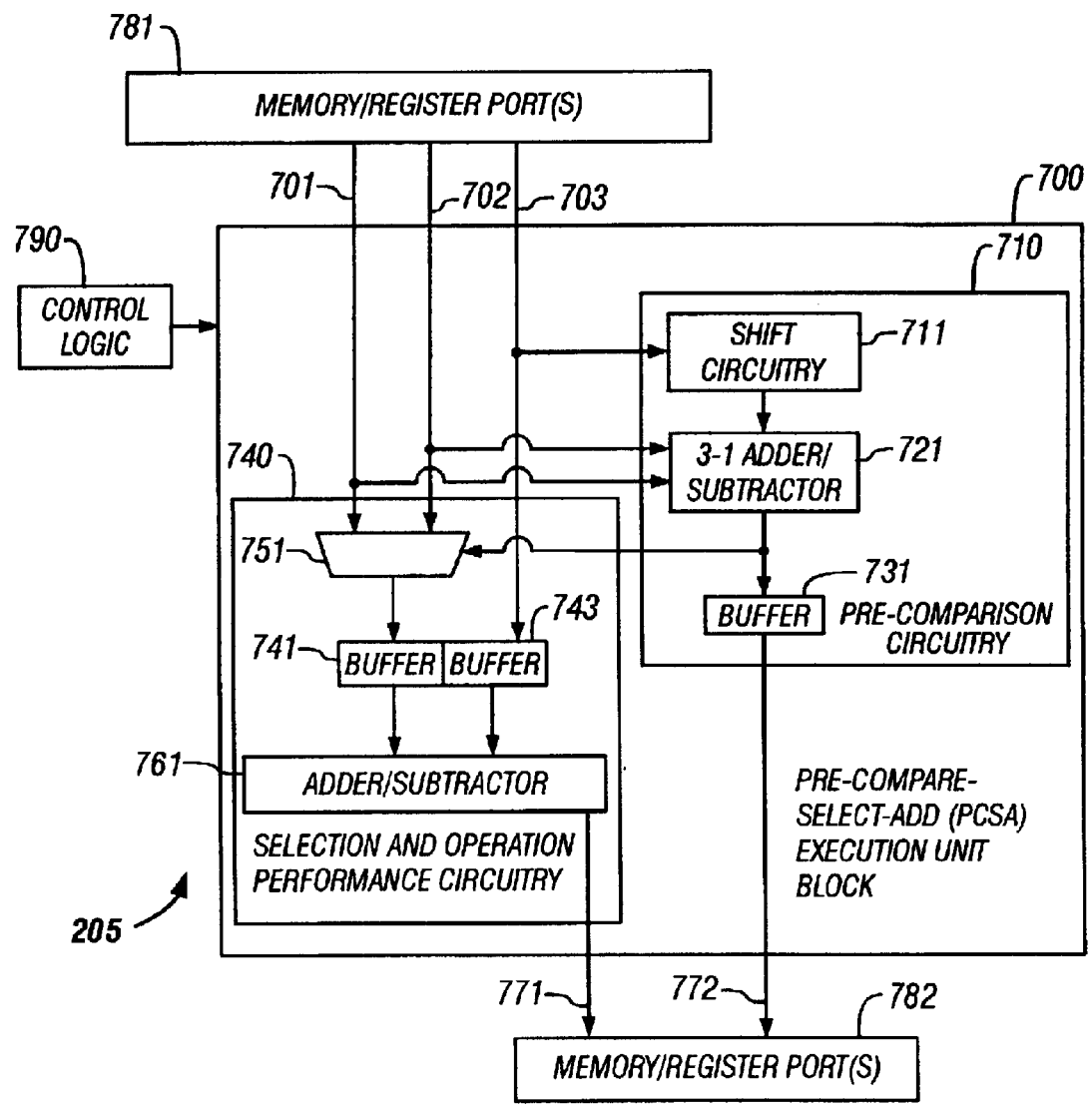
FIG. 7 illustrates, for another embodiment, pre-comparison circuitry and selection and operation performance circuitry for the PCSA execution unit of FIG. 4.

PCSA Execution Unit 205 of FIG. 7

PCSA execution unit 205 for one embodiment may comprise a PCSA execution unit block 700 and control logic 790 coupled to PCSA execution unit block 700, as illustrated in FIG. 7. PCSA execution unit block 700 has inputs 701, 702, and 703, has outputs 771 and 772, comprises pre-comparison circuitry 710 comprising shift circuitry 711, a 3-1 adder/subtractor 721, and a buffer 731, and comprises selection and operation performance circuitry 740 comprising a multiplexer 751, buffers 741 and 743, and an adder/subtractor 761.

Inputs 701, 702, and 703 generally correspond to inputs 501, 502, and 503, respectively, of FIG. 5. Pre-comparison circuitry 710 generally corresponds to pre-comparison circuitry 510. Shift circuitry 711 generally corresponds to shift circuitry 511. 3-1 adder/subtractor 721 generally corresponds to 3-1 adder/subtractor 521. Buffer 731 generally corresponds to buffer 531 except buffer 731 for one embodiment may not have an output to control multiplexer 751.

Selection and operation performance circuitry 740 generally corresponds to selection and operation performance circuitry 540. Multiplexer 751 generally corresponds to multiplexer 551 except multiplexer 751 has inputs coupled to inputs 701 and 702 and to an output of 3-1 adder/subtractor 721 and has an output coupled to buffer 741. Buffer 741 has an input coupled to an output of multiplexer 751 and has an output coupled to adder/subtractor 761. Buffer 743 generally corresponds to buffer 543.

Adder/subtractor 761 generally corresponds to adder/subtractor 561 except adder/subtractor 761 has inputs coupled to outputs of buffers 741 and 743. Outputs 771 and 772 generally correspond to outputs 571 and 572, respectively.

Memory/register port(s) 781 and 782 generally correspond to memory/register port(s) 581 and 582, respectively. Control logic 790 generally corresponds to control logic 590.

Control logic 790 for one embodiment may control PCSA execution unit block 700 similarly as control logic 590 may control PCSA execution unit block 500 except control logic 790 controls PCSA execution unit block 700 for block 312 of FIG. 3 by controlling 3-1 adder/subtractor 721 to output data indicating how a first result compares to a second result to control multiplexer 751 to output in a selective manner either the received first input data or the received second input data to buffer 741. Control logic 790 for one embodiment may control adder/subtractor 761 for block 314 to perform an addition or subtraction operation on input data to produce either the first or second result for a pre-compare-select-add operation depending on how the first result compares to the second result.

Control logic 790 for one embodiment may control PCSA execution unit block 700 to perform pre-compare-select-add operations in a pipelined manner.

Control logic 790 for one embodiment may control shift circuitry 711 to shift input data, may control 3-1 adder/subtractor 721 to receive input data and identify how a first result of a first addition or subtraction operation on input data compares to a second result of a second addition or subtraction operation on input data and to output data to buffer 731 and to control multiplexer 751, may control multiplexer 751 to receive input data and to output data in a selective manner to buffer 741, may control buffer 731 to receive and store data output from 3-1 adder/subtractor 721, and may control buffers 741 and 743 to receive and store input data during a first computation cycle for a first pre-compare-select-add operation.

Control logic 790 for one embodiment may control buffers 731, 741, and 743 to output stored data and may control adder/subtractor 761 to receive input data from buffers 741 and 743, to perform an addition or subtraction operation on input data to produce either the first or second result, and to output the produced result during a second computation cycle for the first pre-compare-select-add operation.

Control logic 790 for one embodiment may control PCSA execution unit block 700 to overlap in time the performance of the first computation cycle for a second pre-compare-select-add operation with the performance of the second computation cycle for the first pre-compare-select-add operation. Control logic 790 for one embodiment may then control PCSA execution unit block 700 to receive new input data for a new pre-compare-select-add operation for each of multiple consecutive computation cycles and, after an initial one computation cycle latency period, to output a selected result for a completed pre-compare-select-add operation for each of multiple consecutive computation cycles.

Figure 8:
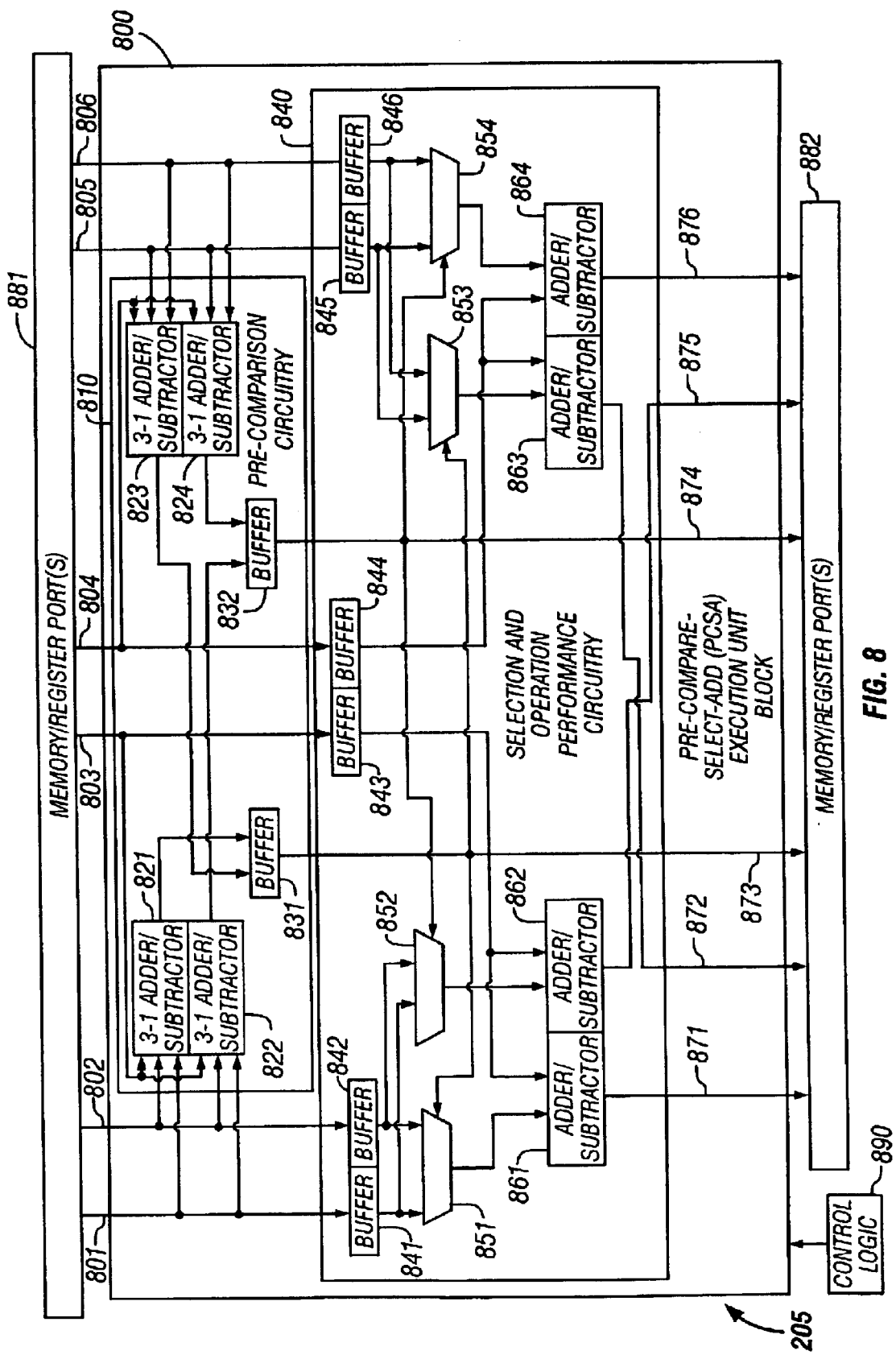
FIG. 8 illustrates, for another embodiment, a PCSA execution unit.

PCSA Execution Unit 205 of FIG. 8

PCSA execution unit 205 for one embodiment may comprise a PCSA execution unit block 800 and control logic 890 coupled to PCSA execution unit block 800, as illustrated in FIG. 8. Control logic 890 for one embodiment may control PCSA execution unit block 800 to perform one pre-compare-select-add operation and/or to perform multiple pre-compare-select-add operations in parallel.

PCSA execution unit block 800 has inputs 801, 802, 803, 804, 805, and 806, has outputs 871, 872, 873, 874, 875, and 876, and comprises pre-comparison circuitry 810 and selection and operation performance circuitry 840.

Pre-comparison circuitry 810 is coupled to inputs 801, 802, 803, 804, 805, and 806 and has outputs coupled to selection and operation performance circuitry 840 and to outputs 873 and 874. Control logic 890 for one embodiment may control pre-comparison circuitry 810 for block 306 of FIG. 3 to receive first, second, and third input data and/or fourth, fifth, and sixth input data at inputs 801, 802, 803, 804, 805, and 806, respectively, from one or more memory and/or register ports 881 and for block 308 to identify how a first result of a first operation on input data compares to a second result of a second operation on input data for one or more pre-compare-select-add operations. Control logic 890 for one embodiment may control pre-comparison circuitry 810 for block 310 to store data indicating how the first result compares to the second result for one or more pre-compare-select-add operations. Control logic 890 for one embodiment may control pre-comparison circuitry 810 for blocks 320 and/or 324 to output to one or more memory and/or register ports 882 at outputs 873 and/or 874 data indicating how the first result compares to the second result for one or more pre-compare-select-add operations.

Selection and operation performance circuitry 840 is coupled to inputs 801, 802, 803, 804, 805, and 806, to outputs 871, 872, 875, and 876, and to outputs of pre-comparison circuitry 810. Control logic 890 for one embodiment may control selection and operation performance circuitry 840 to receive first, second, and third input data and/or fourth, fifth, and sixth input data from inputs 801, 802, 803, 804, 805, and 806, respectively, and to receive from pre-comparison circuitry 810 data indicating how a first result of a first operation on input data compares to a second result of a second operation on input data for one or more pre-compare-select-add operations. Control logic 890 for one embodiment may control selection and operation performance circuitry 840 for block 312 of FIG. 3 to select the first result or the second result for one or more pre-compare-select-add operations based on the received data. Control logic 890 for one embodiment may control selection and operation performance circuitry 840 for block 314 to perform the first operation or the second operation to produce the selected result for one or more pre-compare-select-add operations and for block 316 to output the selected result for one or more pre-compare-select-add operations to one or more memory and/or register ports 882 at outputs 871, 872, 875, and/or 876.

Pre-comparison circuitry 810 for one embodiment comprises 3-1 adder/subtractors 821, 822, 823, and 824 and buffers 831 and 832. 3-1 adder/subtractors 821 and 822 and/or 3-1 adder/subtractors 823 and 824 for one embodiment may be implemented as dual 3-1 adder/subtractors.

For one embodiment, the input data lines from input 803 are shifted to shift third input data by one or more bits relative to input 803 to produce a multiple of the third input data for input to 3-1 adder/subtractors 821 and 822. Pre-comparison circuitry 810 for another embodiment may comprise suitable shift circuitry to shift bits of third input data at input 803 by one or more bits for input to 3-1 adder/subtractors 821 and 822.

For one embodiment, the input data lines from input 804 are shifted to shift fourth input data by one or more bits relative to input 804 to produce a multiple of the fourth input data for input to 3-1 adder/subtractors 823 and 824. Pre-comparison circuitry 810 for another embodiment may comprise suitable shift circuitry to shift bits of fourth input data at input 804 by one or more bits for input to 3-1 adder/subtractors 823 and 824.

Selection and operation performance circuitry 840 for one embodiment comprises buffers 841, 842, 843, 844, 845, and 846, multiplexers 851, 852, 853, and 854, and adder/subtractors 861, 862, 863, and 864. Adder/subtractors 861 and 862 and/or adder/subtractors 863 and 864 for one embodiment may be implemented as dual adder/subtractors.

For one embodiment, 3-1 adder/subtractor 821, buffer 831, buffers 841, 842, and 843, multiplexer 851, and adder/subtractor 861 are similarly coupled as 3-1 adder/subtractor 521, buffer 531, buffers 541, 542, and 543, multiplexer 551, and adder/subtractor 561, respectively, of FIG. 5, with inputs 801, 802, and 803 corresponding to inputs 501, 502, and 503, respectively, and with outputs 871 and 873 corresponding to outputs 571 and 572, respectively.

Control logic 890 for one embodiment may control 3-1 adder/subtractor 821, buffer 831, buffers 841, 842, and 843, multiplexer 851, and adder/subtractor 861 to perform a first pre-compare-select-add operation on first, second, and third input data received from inputs 801, 802, and 803, respectively, to output the selected result for the first pre-compare-select-add operation at output 871, and to output data indicating how a first result of a first addition or subtraction operation on input data compares to a second result of a second addition or subtraction operation on input data for the first pre-compare-select-add operation from buffer 831 to output 873.

For one embodiment, 3-1 adder/subtractor 822, buffer 832, buffers 841, 842, and 843, multiplexer 852, and adder/subtractor 862 are similarly coupled as 3-1 adder/subtractor 521, buffer 531, buffers 541, 542, and 543, multiplexer 551, and adder/subtractor 561, respectively, of FIG. 5, with inputs 801, 802, and 803 corresponding to inputs 501, 502, and 503, respectively, and with outputs 875 and 874 corresponding to outputs 571 and 572, respectively.

Control logic 890 for one embodiment may control 3-1 adder/subtractor 822, buffer 832, buffers 841, 842, and 843, multiplexer 852, and adder/subtractor 862 to perform a second pre-compare-select-add operation on first, second, and third input data received from inputs 801, 802, and 803, respectively, to output the selected result for the second pre-compare-select-add operation at output 875, and to output data indicating how a first result of a first addition or subtraction operation on input data compares to a second result of a second addition or subtraction operation on input data for the second pre-compare-select-add operation from buffer 832 to output 874.

For one embodiment, 3-1 adder/subtractor 823, buffer 831, buffers 844, 845, and 846, multiplexer 853, and adder/subtractor 863 are similarly coupled as 3-1 adder/subtractor 521, buffer 531, buffers 543, 541, and 542, multiplexer 551, and adder/subtractor 561, respectively, of FIG. 5, with inputs 804, 805, and 806 corresponding to inputs 503, 501, and 502, respectively, and with outputs 872 and 873 corresponding to outputs 571 and 572, respectively.

Control logic 890 for one embodiment may control 3-1 adder/subtractor 823, buffer 831, buffers 844, 845, and 846, multiplexer 853, and adder/subtractor 863 to perform a third pre-compare-select-add operation on fourth, fifth, and sixth input data received from inputs 804, 805, and 806, respectively, to output the selected result for the third pre-compare-select-add operation at output 872, and to output data indicating how a first result of a first addition or subtraction operation on input data compares to a second result of a second addition or subtraction operation on input data for the third pre-compare-select-add operation from buffer 831 to output 873.

For one embodiment, 3-1 adder/subtractor 824, buffer 832, buffers 844, 845, and 846, multiplexer 854, and adder/subtractor 864 are similarly coupled as 3-1 adder/subtractor 521, buffer 531, buffers 543, 541, and 542, multiplexer 551, and adder/subtractor 561, respectively, of FIG. 5, with inputs 804, 805, and 806 corresponding to inputs 503, 501, and 502, respectively, and with outputs 876 and 874 corresponding to outputs 571 and 572, respectively.

Control logic 890 for one embodiment may control 3-1 adder/subtractor 824, buffer 832, buffers 844, 845, and 846, multiplexer 854, and adder/subtractor 864 to perform a fourth pre-compare-select-add operation on fourth, fifth, and sixth input data received from inputs 804, 805, and 806, respectively, to output the selected result for the fourth pre-compare-select-add operation at output 876, and to output data indicating how a first result of a first addition or subtraction operation on input data compares to a second result of a second addition or subtraction operation on input data for the fourth pre-compare-select-add operation from buffer 832 to output 874.

Although described as comprising two buffers 831 and 832 to store data indicating how a first result of a first addition or subtraction operation on input data compares to a second result of a second addition or subtraction operation on input data for a pre-compare-select-add operation, PCSA execution unit block 800 for another embodiment may comprise only one buffer to store such data for 3-1 adder/subtractors 821, 822, 823, and 824 or may comprise four buffers to store such data for 3-1 adder/subtractors 821, 822, 823, and 824, respectively.

Figure 9:
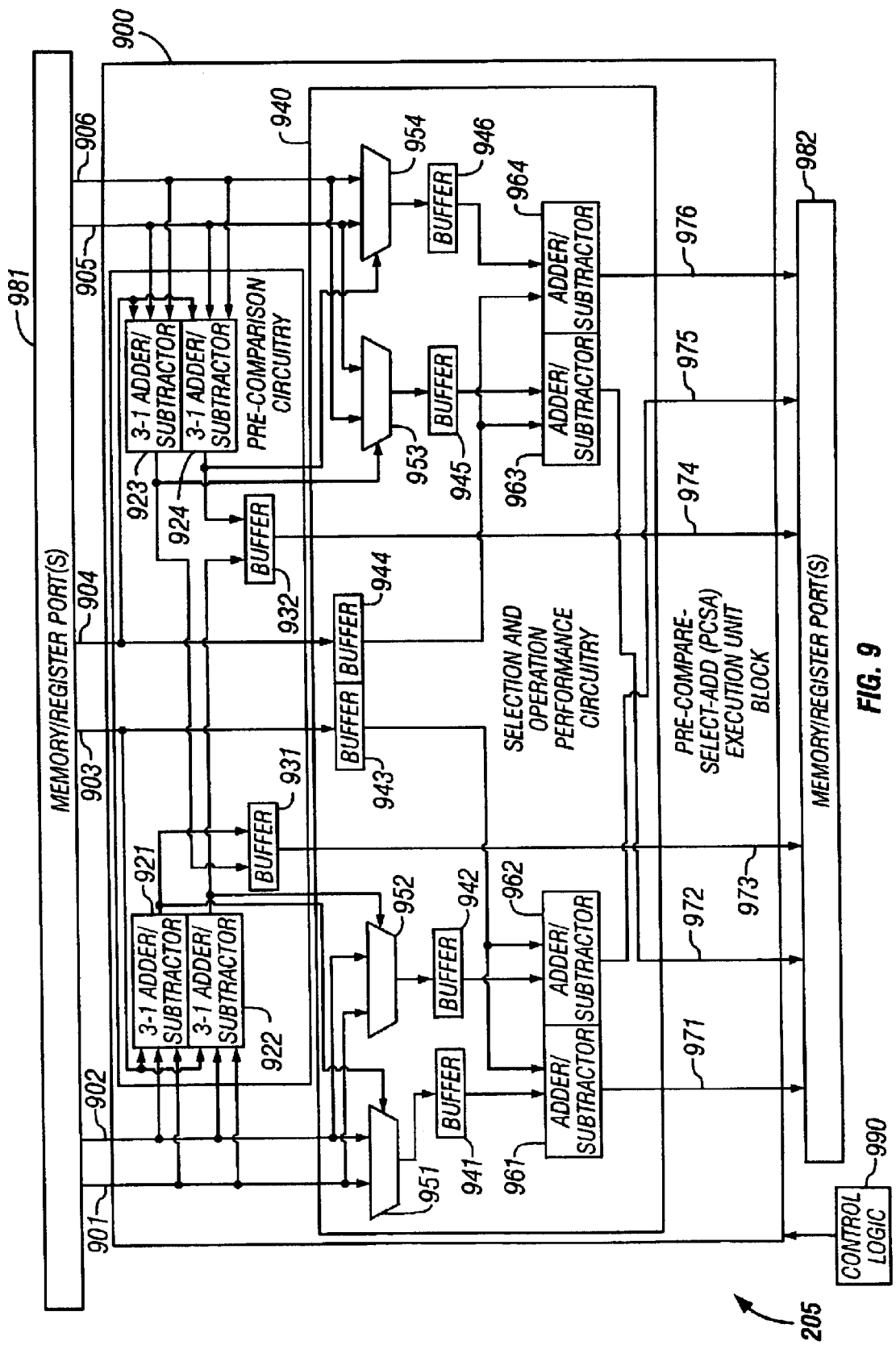
FIG. 9 illustrates, for another embodiment, a PCSA execution unit.

PCSA Execution Unit 205 of FIG. 9

PCSA execution unit 205 for one embodiment may comprise a PCSA execution unit block 900 and control logic 990 coupled to PCSA execution unit block 900, as illustrated in FIG. 9. Control logic 990 for one embodiment may control PCSA execution unit block 900 to perform one pre-compare-select-add operation and/or to perform multiple pre-compare-select add operations in parallel.

PCSA execution unit block 900 has inputs 901, 902, 903, 904, 905, and 906, has outputs 971, 972, 973, 974, 975, and 976, comprises pre-comparison circuitry 910 comprising 3-1 adder/subtractors 921, 922, 923, and 924 and buffers 931 and 932, and comprises selection and operation performance circuitry 940 comprising multiplexers 951, 952, 953, and 954, buffers 941, 942, 943, 944, 945, and 946, and adder/subtractors 961, 962, 963, and 964.

3-1 adder/subtractors 921 and 922 and/or 3-1 adder/subtractors 923 and 924 for one embodiment may be implemented as dual 3-1 adder/subtractors. Adder/subtractors 961 and 962 and/or adder/subtractors 963 and 964 for one embodiment may be implemented as dual adder/subtractors.

Inputs 901, 902, 903, 904, 905, and 906 generally correspond to inputs 801, 802, 803, 804, 805, and 806, respectively, of FIG. 8. Pre-comparison circuitry 910 generally corresponds to pre-comparison circuitry 810. Selection and operation performance circuitry 940 generally corresponds to selection and operation performance circuitry 840. Outputs 971, 972, 973, 974, 975, and 976 generally correspond to outputs 871, 872, 873, 874, 875, and 876, respectively.

Memory/register port(s) 981 and 982 generally correspond to memory/register port(s) 881 and 882, respectively. Control logic 990 generally corresponds to control logic 890.

For one embodiment, 3-1 adder/subtractor 921, buffer 931, multiplexer 951, buffers 941 and 943, and adder/subtractor 961 are similarly coupled as 3-1 adder/subtractor 721, buffer 731, multiplexer 751, buffers 741 and 743, and adder/subtractor 761, respectively, of FIG. 7, with inputs 901, 902, and 903 corresponding to inputs 701, 702, and 703, respectively, and with outputs 971 and 973 corresponding to outputs 771 and 772, respectively.

Control logic 990 for one embodiment may control 3-1 adder/subtractor 921, buffer 931, multiplexer 951, buffers 941 and 943, and adder/subtractor 961 to perform a first pre-compare-select-add operation on first, second, and third input data received from inputs 901, 902, and 903, respectively, to output the selected result for the first pre-compare-select-add operation at output 971, and to output data indicating how a first result of a first addition or subtraction operation on input data compares to a second result of a second addition or subtraction operation on input data for the first pre-compare-select-add operation from buffer 931 to output 973.

For one embodiment, 3-1 adder/subtractor 922, buffer 932, multiplexer 952, buffers 942 and 943, and adder/subtractor 962 are similarly coupled as 3-1 adder/subtractor 721, buffer 731, multiplexer 751, buffers 741 and 743, and adder/subtractor 761, respectively, of FIG. 7, with inputs 901, 902, and 903 corresponding to inputs 701, 702, and 703, respectively, and with outputs 975 and 974 corresponding to outputs 771 and 772, respectively.

Control logic 990 for one embodiment may control 3-1 adder/subtractor 922, buffer 932, multiplexer 952, buffers 942 and 943, and adder/subtractor 962 to perform a second pre-compare-select-add operation on first, second, and third input data received from inputs 901, 902, and 903, respectively, to output the selected result for the second pre-compare-select-add operation at output 975, and to output data indicating how a first result of a first addition or subtraction operation on input data compares to a second result of a second addition or subtraction operation on input data for the second pre-compare-select-add operation from buffer 932 to output 974.

For one embodiment, 3-1 adder/subtractor 923, buffer 931, multiplexer 953, buffers 944 and 945, and adder/subtractor 963 are similarly coupled as 3-1 adder/subtractor 721, buffer 731, multiplexer 751, buffers 743 and 741, and adder/subtractor 761, respectively, of FIG. 7, with inputs 904, 905, and 906 corresponding to inputs 703, 701, and 702, respectively, and with outputs 972 and 973 corresponding to outputs 771 and 772, respectively.

Control logic 990 for one embodiment may control 3-1 adder/subtractor 923, buffer 931, multiplexer 953, buffers 944 and 945, and adder/subtractor 963 to perform a third pre-compare-select-add operation on fourth, fifth, and sixth input data received from inputs 904, 905, and 906, respectively, to output the selected result for the third pre-compare-select-add operation at output 972, and to output data indicating how a first result of a first addition or subtraction operation on input data compares to a second result of a second addition or subtraction operation on input data for the third pre-compare-select-add operation from buffer 931 to output 973.

For one embodiment, 3-1 adder/subtractor 924, buffer 932, multiplexer 954, buffers 944 and 946, and adder/subtractor 964 are similarly coupled as 3-1 adder/subtractor 721, buffer 731, multiplexer 751, buffers 743 and 741, and adder/subtractor 761, respectively, of FIG. 7, with inputs 904, 905, and 906 corresponding to inputs 703, 701, and 702, respectively, and with outputs 976 and 974 corresponding to outputs 771 and 772, respectively.

Control logic 990 for one embodiment may control 3-1 adder/subtractor 924, buffer 932, multiplexer 954, buffers 944 and 946, and adder/subtractor 964 to perform a fourth pre-compare-select-add operation on fourth, fifth, and sixth input data received from inputs 904, 905, and 906, respectively, to output the selected result for the fourth pre-compare-select-add operation at output 976, and to output data indicating how a first result of a first addition or subtraction operation on input data compares to a second result of a second addition or subtraction operation on input data for the fourth pre-compare-select-add operation from buffer 932 to output 974.

Although described as comprising two buffers 931 and 932 to store data indicating how a first result of a first addition or subtraction operation on input data compares to a second result of a second addition or subtraction operation on input data for a pre-compare-select-add operation, PCSA execution unit block 900 for another embodiment may comprise only one buffer to store such data for 3-1 adder/subtractors 921, 922, 923, and 924 or may comprise four buffers to store such data for 3-1 adder/subtractors 921, 922, 923, and 924, respectively.

PCSA execution unit block 900 for one embodiment may be implemented using hardware of a digital signal processing (DSP) core with a 3-1 adder/subtractor associated with one or more multiplier-accumulators (MACs) and with an adder/subtractor between the accumulators of the MAC and memory or register ports. Buffers 941 and 942 and multiplexers 951 and 952 may be implemented using corresponding accumulators and multiplexers, respectively, of one MAC, and buffers 945 and 946 and multiplexers 953 and 954 may be implemented using corresponding accumulators and multiplexers, respectively, of another MAC.

Figure 10:
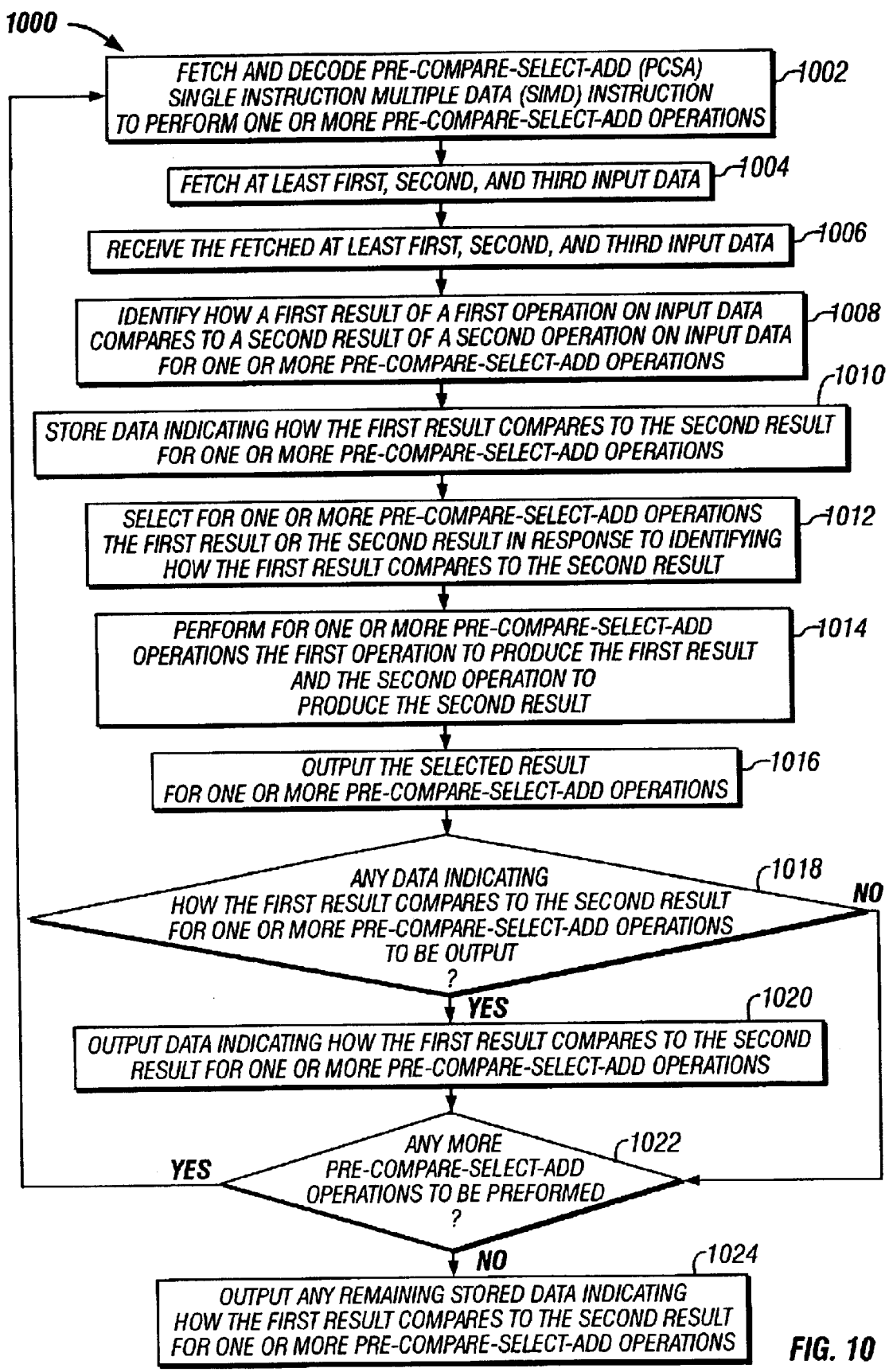
FIG. 10 illustrates, for another embodiment, a flow diagram to perform one or more pre-compare-select-add operations.

Flow Diagram 1000 of FIG. 10

Instruction processing logic 200 for another embodiment may perform one or more pre-compare-select-add operations in accordance with a flow diagram 1000 as illustrated in FIG. 10. Although flow diagram 1000 is described in connection with PCSA execution unit 205, any one or more PCSA execution units 103, such as PCSA execution unit 206 for example, may be used to perform one or more pre-compare-select-add operations in accordance with flow diagram 1000.

Blocks 1002, 1004, 1006, 1008, 1010, and 1012 generally correspond to blocks 302, 304, 306, 308, 310, and 312, respectively, of FIG. 3.

For block 1014, PCSA execution unit 205 performs for one or more pre-compare-select-add operations both the first operation to produce the first result and the second operation to produce the second result. PCSA execution unit 205 may perform the first operation and the second operation in any suitable manner.

Blocks 1016, 1018, 1020, 1022, and 1024 generally correspond to blocks 316, 318, 320, 322, and 324, respectively, of FIG. 3.

Instruction processing logic 200 may perform operations for blocks 1002–1024 in any suitable order and may or may not overlap in time the performance of any suitable operation with any other suitable operation. Instruction processing logic 200 for one embodiment may at least partially overlap in time the performance of suitable operations for any blocks 1002–1024 in a pipelined manner.

Instruction processing logic 200 for one embodiment may support saturation, precision adjustment, and/or data packing in performing one or more pre-compare-select-add operations in accordance with flow diagram 1000.

Although described in the context of performing pre-compare-select-add operations using a SIMD technique, one or more PCSA execution units 103 for another embodiment may be controlled to perform one or more pre-compare-select-add operations in accordance with flow diagram 1000 using any other suitable technique.

Each of one or more PCSA execution units 103, such as PCSA execution unit 205 and/or PCSA execution unit 206 for example, may have any suitable number of inputs to receive any suitable number of input data for block 1006, may comprise any suitable circuitry to perform any suitable number of one or more pre-compare-select-add operations on input data for blocks 1008, 1010, 1012, and 1014, and may have any suitable number of outputs to output any suitable number of selected results for block 1016 and/or data indicating how a first result compares to a second result for one or more pre-compare-select-add operations for blocks 1020 and/or 1024. One or more PCSA execution units of PCSA execution unit(s) 103 may or may not be implemented similarly.

PCSA Execution Unit 205 of FIG. 4

PCSA execution unit 205 for one embodiment may comprise PCSA execution unit block 400 and control logic 490, as illustrated in FIG. 4.

Control logic 490 for one embodiment may control pre-comparison circuitry 410 for block 1006 of FIG. 10 to receive first, second, and third input data at inputs 401, 402, and 403, respectively, from one or more memory and/or register ports 481 and for block 1008 to identify how a first result of a first operation on input data compares to a second result of a second operation on input data for a pre-compare-select-add operation. Control logic 490 for one embodiment may control pre-comparison circuitry 410 for block 1010 to store data indicating how the first result compares to the second result for one or more pre-compare-select-add operations. Control logic 490 for one embodiment may control pre-comparison circuitry 410 for blocks 1020 and/or 1024 to output to one or more memory and/or register ports 482 at output 472 data indicating how the first result compares to the second result for one or more pre-compare-select-add operations.

Control logic 490 for one embodiment may control selection and operation performance circuitry 440 to receive first, second, and third input data from inputs 401, 402, and 403, respectively, and to receive from pre-comparison circuitry 410 data indicating how a first result of a first operation on input data compares to a second result of a second operation on input data for a pre-compare-select-add operation. Control logic 490 for one embodiment may control selection and operation performance circuitry 440 for block 1012 of FIG. 10 to select the first result or the second result based on the received data. Control logic 490 for one embodiment may control selection and operation performance circuitry 440 for block 1014 to perform the first operation to produce the first result and the second operation to produce the second result and for block 1016 to output the selected result to one or more memory and/or register ports 482 at output 471.

PCSA execution unit block 400 may comprise any suitable circuitry for pre-comparison circuitry 410 and for selection and operation performance circuitry 440.

Figure 11:
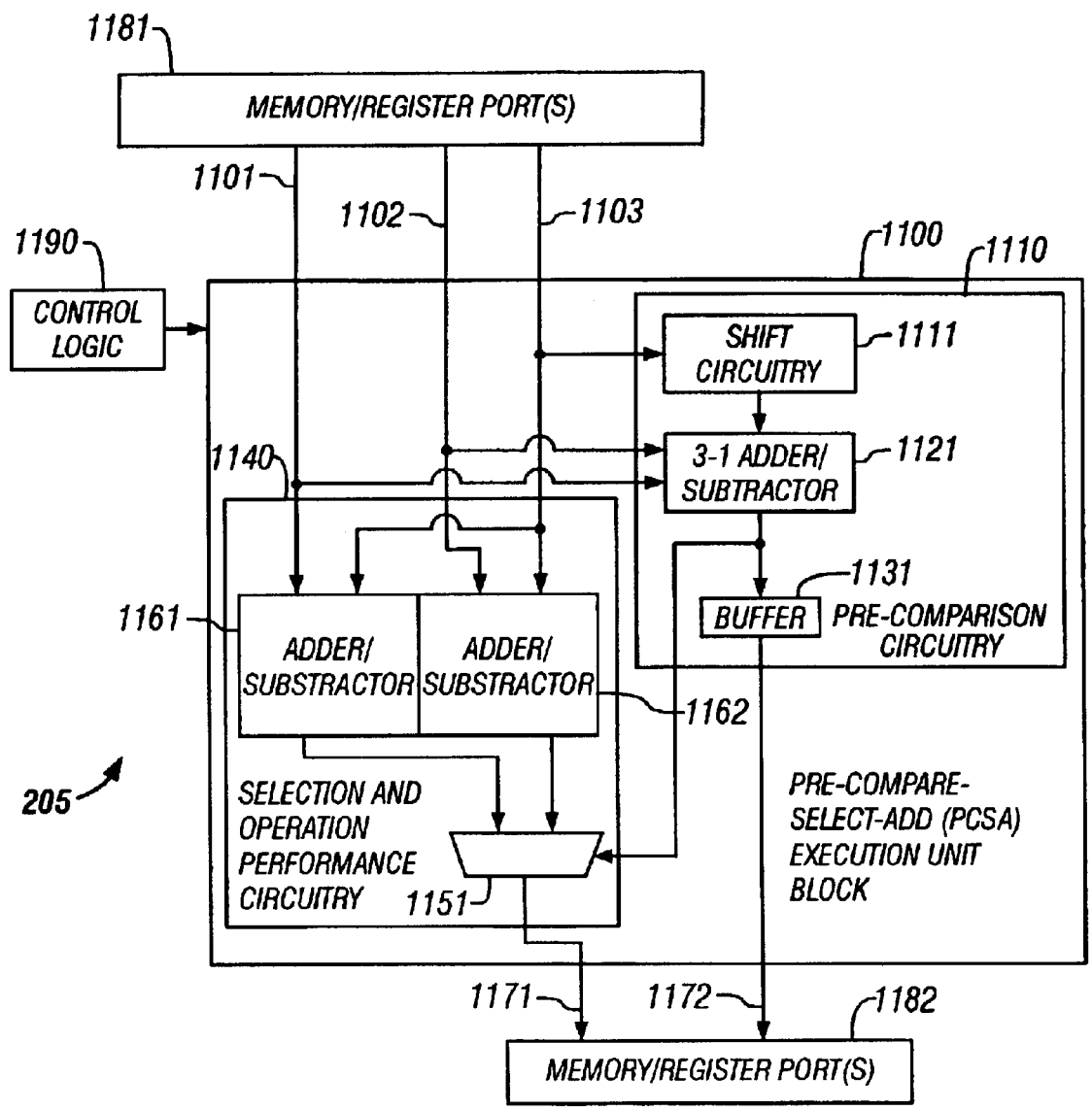
FIG. 11 illustrates, for another embodiment, pre-comparison circuitry and selection and operation performance circuitry for the PCSA execution unit of FIG. 4.

PCSA Execution Unit 205 of FIG. 11

PCSA execution unit 205 for one embodiment may comprise a PCSA execution unit block 1100 and control logic 1190 coupled to PCSA execution unit block 1100, as illustrated in FIG. 11. PCSA execution unit block 1100 has inputs 1101, 1102, and 1103, has outputs 1171 and 1172, and comprises pre-comparison circuitry 1110 and selection and operation performance circuitry 1140.

Inputs 1101, 1102, and 1103 generally correspond to inputs 401, 402, and 403, respectively, of FIG. 4. Outputs 1171 and 1172 generally correspond to outputs 471 and 472, respectively. Pre-comparison circuitry 1110 and selection and operation performance circuitry 1140 generally correspond to pre-comparison circuitry 410 and selection and operation performance circuitry 440, respectively. Memory/register port(s) 1181 and 1182 generally correspond to memory/register port(s) 481 and 482, respectively.

Pre-comparison circuitry 1110 for one embodiment comprises shift circuitry 1111, a 3-1 adder/subtractor 1121, and a buffer 1131. Shift circuitry 1111, 3-1 adder/subtractor 1121, and buffer 1131 generally correspond to shift circuitry 711, 3-1 adder/subtractor 721, and buffer 731 of FIG. 7.

Selection and operation performance circuitry 1140 for one embodiment comprises adder/subtractors 1161 and 1162 and a multiplexer 1151. Adder/subtractors 1161 and 1162 for one embodiment may be implemented as a dual adder/subtractor.

Adder/subtractor 1161 has inputs coupled to inputs 1101 and 1103 and an output coupled to an input of multiplexer 1151. Control logic 1190 for one embodiment may control adder/subtractor 1161 to receive first input data and third input data at inputs 1101 and 1103, respectively, to perform for block 1014 of FIG. 10 a first addition or subtraction operation on the first and third input data to produce a first result for a pre-compare-select-add operation, and to output the first result to multiplexer 1151.

Adder/subtractor 1162 has inputs coupled to inputs 1102 and 1103 and an output coupled to an input of multiplexer 1151. Control logic 1190 for one embodiment may control adder/subtractor 1162 to receive second input data and third input data at inputs 1102 and 1103, respectively, to perform for block 1014 of FIG. 10 a second addition or subtraction operation on the second and third input data to produce a second result for the pre-compare-select-add operation, and to output the second result to multiplexer 1151.

Multiplexer 1151 has inputs coupled to outputs of adder/subtractors 1161 and 1162 and to an output of 3-1 adder/subtractor 1121 and has an output coupled to output 1171. Control logic 1190 for one embodiment for block 1012 of FIG. 10 may control multiplexer 1151 to receive the first result output from adder/subtractor 1161 and the second result output from adder/subtractor 1162 and may control 3-1 adder/subtractor 1121 to output data indicating how the first result compares to the second result to control multiplexer 1151 for block 1016 to output in a selective manner either the received first result or the received second result at output 1171 to one or more memory and/or register ports 1182.

Control logic 1190 for one embodiment may control pre-comparison circuitry 1110 and selection and operation performance circuitry 1140 to perform a pre-compare-select-add operation on first, second, and third input data received from inputs 1101, 1102, and 1103, respectively, to output the selected result for the pre-compare-select-add operation at output 1171, and to output data indicating how a first result of a first addition or subtraction operation on input data compares to a second result of a second addition or subtraction operation on input data for the pre-compare-select-add operation from buffer 1131 to output 1172 during a single computation cycle. Control logic 1190 for one embodiment may then control PCSA execution unit block 1100 to receive new input data for a new pre-compare-select-add operation for each of multiple consecutive computation cycles and to output a selected result for a completed pre-compare-select-add operation for each of multiple consecutive computation cycles.

Figure 12:
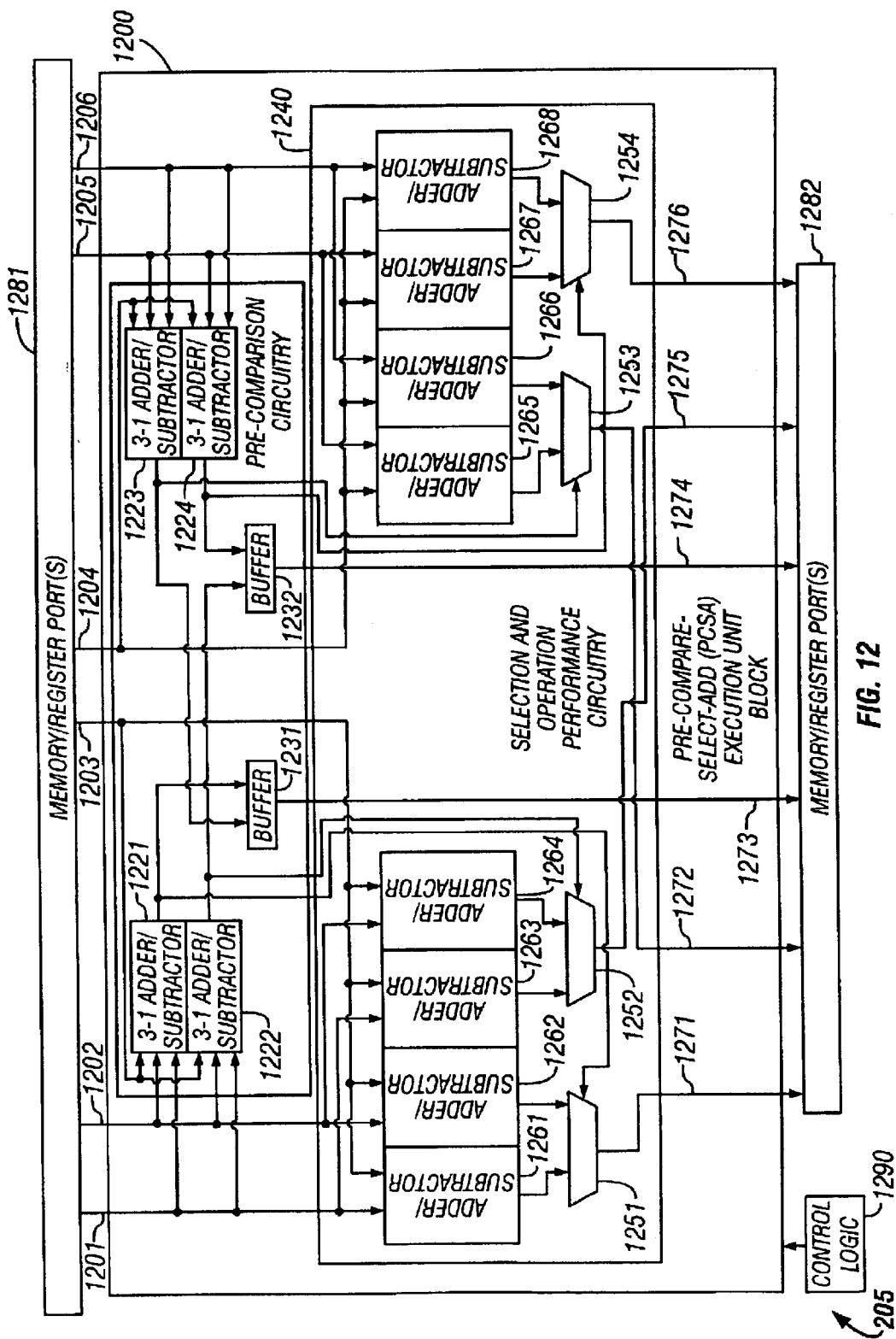
FIG. 12 illustrates, for another embodiment, a PCSA execution unit.

PCSA Execution Unit 205 of FIG. 12

PCSA execution unit 205 for one embodiment may comprise a PCSA execution unit block 1200 and control logic 1290 coupled to PCSA execution unit block 1200, as illustrated in FIG. 12. Control logic 1290 for one embodiment may control PCSA execution unit block 1200 to perform one pre-compare-select-add operation and/or to perform multiple pre-compare-select add operations in parallel.

PCSA execution unit block 1200 has inputs 1201, 1202, 1203, 1204, 1205, and 1206, has outputs 1271, 1272, 1273, 1274, 1275, and 1276, comprises pre-comparison circuitry 1210 comprising 3-1 adder/subtractors 1221, 1222, 1223, and 1224 and buffers 1231 and 1232, and comprises selection and operation performance circuitry 1240 comprising adder/subtractors 1261, 1262, 1263, 1264, 1265, 1266, 1267, and 1268 and multiplexers 1251, 1252, 1253, and 1254.

3-1 adder/subtractors 1221 and 1222 and/or 3-1 adder/subtractors 1223 and 1224 for one embodiment may be implemented as dual 3-1 adder/subtractors. Any suitable two adder/subtractors 1261, 1262, 1263, 1264, 1265, 1266, 1267, 1268 for one embodiment may be implemented as dual adder/subtractors.

Inputs 1201, 1202, 1203, 1204, 1205, and 1206 generally correspond to inputs 801, 802, 803, 804, 805, and 806, respectively, of FIG. 8. Pre-comparison circuitry 1210 generally corresponds to pre-comparison circuitry 810. Selection and operation performance circuitry 1240 generally corresponds to selection and operation performance circuitry 840. Outputs 1271, 1272, 1273, 1274, 1275, and 1276 generally correspond to outputs 871, 872, 873, 874, 875, and 876, respectively.

Memory/register port(s) 1281 and 1282 generally correspond to memory/register port(s) 881 and 882, respectively. Control logic 1290 generally corresponds to control logic 890.

For one embodiment, 3-1 adder/subtractor 1221, buffer 1231, adder/subtractors 1261 and 1262, and multiplexer 1251 are similarly coupled as 3-1 adder/subtractor 1121, buffer 1131, adder/subtractors 1161 and 1162, and multiplexer 1151, respectively, of FIG. 11, with inputs 1201, 1202, and 1203 corresponding to inputs 1101, 1102, and 1103, respectively, and with outputs 1271 and 1273 corresponding to outputs 1171 and 1172, respectively.

Control logic 1290 for one embodiment may control 3-1 adder/subtractor 1221, buffer 1231, adder/subtractors 1261 and 1262, and multiplexer 1251 to perform a first pre-compare-select-add operation on first, second, and third input data received from inputs 1201, 1202, and 1203, respectively, to output the selected result for the first pre-compare-select-add operation at output 1271, and to output data indicating how a first result of a first addition or subtraction operation on input data compares to a second result of a second addition or subtraction operation on input data for the first pre-compare-select-add operation from buffer 1231 to output 1273.

For one embodiment, 3-1 adder/subtractor 1222, buffer 1232, adder/subtractors 1263 and 1264, and multiplexer 1252 are similarly coupled as 3-1 adder/subtractor 1121, buffer 1131, adder/subtractors 1161 and 1162, and multiplexer 1151, respectively, of FIG. 11, with inputs 1201, 1202, and 1203 corresponding to inputs 1101, 1102, and 1103, respectively, and with outputs 1275 and 1274 corresponding to outputs 1171 and 1172, respectively.

Control logic 1290 for one embodiment may control 3-1 adder/subtractor 1222, buffer 1232, adder/subtractors 1263 and 1264, and multiplexer 1252 to perform a second pre-compare-select-add operation on first, second, and third input data received from inputs 1201, 1202, and 1203, respectively, to output the selected result for the second pre-compare-select-add operation at output 1275, and to output data indicating how a first result of a first addition or subtraction operation on input data compares to a second result of a second addition or subtraction operation on input data for the second pre-compare-select-add operation from buffer 1232 to output 1274.

For one embodiment, 3-1 adder/subtractor 1223, buffer 1231, adder/subtractors 1265 and 1266, and multiplexer 1253 are similarly coupled as 3-1 adder/subtractor 1121, buffer 1131, adder/subtractors 1161 and 1162, and multiplexer 1151, respectively, of FIG. 11, with inputs 1204, 1205, and 1206 corresponding to inputs 1103, 1101, and 1102, respectively, and with outputs 1272 and 1273 corresponding to outputs 1171 and 1172, respectively.

Control logic 1290 for one embodiment may control 3-1 adder/subtractor 1223, buffer 1231, adder/subtractors 1265 and 1266, and multiplexer 1253 to perform a third pre-compare-select-add operation on fourth, fifth, and sixth input data received from inputs 1204, 1205, and 1206, respectively, to output the selected result for the third pre-compare-select-add operation at output 1272, and to output data indicating how a first result of a first addition or subtraction operation on input data compares to a second result of a second addition or subtraction operation on input data for the third pre-compare-select-add operation from buffer 1231 to output 1273.

For one embodiment, 3-1 adder/subtractor 1224, buffer 1232, adder/subtractors 1267 and 1268, and multiplexer 1254 are similarly coupled as 3-1 adder/subtractor 1121, buffer 1131, adder/subtractors 1161 and 1162, and multiplexer 1151, respectively, of FIG. 11, with inputs 1204, 1205, and 1206 corresponding to inputs 1103, 1101, and 1102, respectively, and with outputs 1276 and 1274 corresponding to outputs 1171 and 1172, respectively.

Control logic 1290 for one embodiment may control 3-1 adder/subtractor 1224, buffer 1232, adder/subtractors 1267 and 1268, and multiplexer 1254 to perform a fourth pre-compare-select-add operation on fourth, fifth, and sixth input data received from inputs 1204, 1205, and 1206, respectively, to output the selected result for the fourth pre-compare-select-add operation at output 1276, and to output data indicating how a first result of a first addition or subtraction operation on input data compares to a second result of a second addition or subtraction operation on input data for the fourth pre-compare-select-add operation from buffer 1232 to output 1274.

Although described as comprising two buffers 1231 and 1232 to store data indicating how a first result of a first addition or subtraction operation on input data compares to a second result of a second addition or subtraction operation on input data for a pre-compare-select-add operation, PCSA execution unit block 1200 for another embodiment may comprise only one buffer to store such data for 3-1 adder/subtractors 1221, 1222, 1223, and 1224 or may comprise four buffers to store such data for 3-1 adder/subtractors 1221, 1222, 1223, and 1224, respectively.

VITERBI ALGORITHM EXAMPLE

Processor 102 of FIG. 1 may use one or more PCSA execution units 103 for one embodiment to help accelerate the performance of add-compare-select operations in performing any suitable digital signal processing such as pattern recognition, for example, for error correction in communications applications, for image recognition applications, for speech recognition applications, and/or for handwriting recognition applications, for example.

As one example, processor 102 may use one or more PCSA execution units 103 to perform metric updates for one or more states for a suitable Viterbi algorithm. One or more PCSA execution units 103 may be used to compute, for example, one or more Viterbi butterflies, for example. For a Viterbi algorithm having a constraint length of K=5 and a coding rate of 1/2, PCSA execution unit 205 of FIGS. 8, 9, and 12, for example, for one embodiment may compute the following Viterbi butterfly:

new_metric(0)=max(old_metric(0)+sum, old_metric(1)−sum); and new_metric(8)=max(old_metric(0)−sum, old_metric(1)+sum)

in parallel with the following Viterbi butterfly:

new_metric(1)=max(old_metric(2)+difference, old_metric(3)−difference); and new_metric(9)=max(old_metric(2)−difference, old_metric(3)+difference)

for the Viterbi algorithm where:
new_metric(i) is a new accumulated metric value for state i;
old_metric(i) is an old accumulated metric value for state i; and
sum and difference are local distance values based on soft-decision inputs.

Instruction processing logic 200 for one embodiment may compute these Viterbi butterflies, for example, by performing, in accordance with blocks 302–316 of FIG. 3 or with blocks 1002–1016 of FIG. 10, a first pre-compare-select-add operation to produce new_metric(0), a second pre-compare-select-add operation to produce new_metric(8), a third pre-compare-select-add operation to produce new_metric(1), and a fourth pre-compare-select-add operation to produce new_metric(9).

PCSA execution unit 205 for one embodiment may receive old_metric(0), old_metric(1), sum, difference, old_metric(2), and old_metric(3) as first, second, third, fourth, fifth, and sixth input data, respectively.

For the first pre-compare-select-add operation, PCSA execution unit 205 may identify whether the result of the operation old_metric(0)+sum is greater than or equal to the result of the operation old_metric(1)−sum. If so, PCSA execution unit 205 may perform the operation old_metric(0)+sum and output the result for new_metric(0). Otherwise, PCSA execution unit 205 may perform the operation old_metric(1)−sum and output the result as new_metric(0).

For the second pre-compare-select-add operation, PCSA execution unit 205 may identify whether the result of the operation old_metric(0)−sum is greater than or equal to the result of the operation old_metric(1)+sum. If so, PCSA execution unit 205 may perform the operation old_metric(0)−sum and output the result for new_metric(8). Otherwise, PCSA execution unit 205 may perform the operation old_metric(1)+sum and output the result as new_metric(8).

For the third pre-compare-select-add operation, PCSA execution unit 205 may identify whether the result of the operation old_metric(2)+difference is greater than or equal to the result of the operation old_metric(3)−difference. If so, PCSA execution unit 205 may perform the operation old_metric(2)+difference and output the result for new_metric(1). Otherwise, PCSA execution unit 205 may perform the operation old_metric(3)−difference and output the result as new_metric(1).

For the fourth pre-compare-select-add operation, PCSA execution unit 205 may identify whether the result of the operation old_metric(2)−difference is greater than or equal to the result of the operation old_metric(3)+difference. If so, PCSA execution unit 205 may perform the operation old_metric(2)−difference and output the result for new_metric(9). Otherwise, PCSA execution unit 205 may perform the operation old_metric(3)+difference and output the result as new_metric(9).

Instruction processing logic 200 for one embodiment may similarly use PCSA execution unit 205 to compute the Viterbi butterfly to produce new_metric(2) and new_metric(10) in parallel with the Viterbi butterfly to produce new_metric(3) and new_metric(11), to compute the Viterbi butterfly to produce new_metric(4) and new_metric(12) in parallel with the Viterbi butterfly to produce new_metric(5) and new_metric(13), and to compute the Viterbi butterfly to produce new_metric(6) and new_metric(14) in parallel with the Viterbi butterfly to produce new_metric(7) and new_metric(15) as follows:

new_metric(2)=max(old_metric(4)+sum, old_metric(5)−sum);

new_metric(10)=max(old_metric(4)−sum, old_metric(5)+sum);

new_metric(3)=max(old_metric(6)+difference, old_metric(7)−difference);

new_metric(11)=max(old_metric(6)−difference, old_metric(7)+difference);

new_metric(4)=max(old_metric(8)+sum, old_metric(9)−sum);

new_metric(12)=max(old_metric(8)−sum, old_metric(9)+sum);

new_metric(5)=max(old metric(10)+difference, old_metric(11)−difference);

new_metric(13)=max(old_metric(10)−difference, old_metric(11)+difference);

new_metric(6)=max(old_metric(12)+sum, old_metric(13)−sum);

new_metric(14)=max(old_metric(12)−sum, old_metric(13)+sum);

new_metric(7)=max(old_metric(14)+difference, old_metric(15)−difference); and new_metric(15)=max(old_metric(14)−difference, old_metric(15)+difference).

Because the sum and difference input data are used for each pair of Viterbi butterfly computations, instruction processing logic 200 for one embodiment may store the sum and difference input data in registers 230 and fetch old_metric(i) input data from memory for each pair of Viterbi butterfly computations to help reduce memory bandwidth in fetching input data for PCSA execution unit 205.

Because the new_metric(i) output data may be used as old_metric(i) input data for a subsequent metric update, PCSA execution unit 205 for one embodiment may output new_metric(0) and new_metric(1), for example, in a packed format to the same memory port and new_metric(8) and new_metric(9), for example, in a packed format to the same memory port to help write the new_metric(i) output data in a continuous area of memory and to help load and store the new_metric(i) data in accordance with a SIMD technique.

For one or more Viterbi butterfly computations, PCSA execution unit 205 for one embodiment may store, in accordance with block 310 of FIG. 3 or block 1010 of FIG. 10, data indicating how a first result of a first operation compares to a second result of a second operation for one or more pre-compare-select-add operations. Such data may be used, for example, to perform a traceback routine for the Viterbi algorithm.

Although described as computing two Viterbi butterflies in parallel, PCSA execution unit 205 may comprise suitable circuitry to perform one, three, four, or more Viterbi butterflies in parallel.

Although described as performing pre-compare-select-add operations to perform a Viterbi algorithm, PCSA execution unit 205 may be used to perform pre-compare-select-add operations for any suitable one or more applications.

Although described as performing pre-compare-select-add operations, PCSA execution unit 205 for one embodiment may be used to perform any suitable operation, such as addition, subtraction, and/or a comparison operation for example.

In the foregoing description, one or more embodiments of the present invention have been described. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A machine-implemented method comprising:
receiving first input data, second input data, and third input data;
identifying how a first result of a first operation compares to a second result of a second operation;
selecting the first result or the second result in response to the identifying; and
performing the first operation or the second operation in response to the selecting to produce the selected result,
wherein the identifying comprises identifying how a first result of a first operation on the first input data and the third input data compares to a second result of a second operation on the second input data and the third input data; and wherein the performing comprises performing the first operation on the first input data and the third input data or the second operation on the second input data and the third input data in response to the selecting to produce the selected result.

2. The method of claim 1, comprising storing data indicating how the first result of the first operation compares to the second result of the second operation.

3. The method of claim 1, wherein the identifying comprises shifting bits of the third input data and inputting the first input data, the second input data, and the shifted third input data to a 3-1 adder/subtractor.

4. The method of claim 1, comprising performing the identifying, selecting, and performing for a Viterbi algorithm.

5. A machine-implemented method comprising:
receiving first input data, second input data, and third input data;
identifying how a first result of a first operation compares to a second result of a second operation without producing the first result or the second result;
performing the first operation to produce the first result and the second operation to produce the second result; and
selecting the produced first result or the produced second result in response to the identifying,
wherein the identifying comprises identifying how a first result of a first operation on the first input data and the third input data compares to a second result of a second operation on the second input data and the third input data; and
wherein the performing comprises performing the first operation on the first input data and the third input data to produce the first result and the second operation on the second input data and the third input data to produce the second result.

6. The method of claim 5, comprising storing data indicating how the first result of the first operation compares to the second result of the second operation.

7. The method of claim 5, wherein the identifying comprises shifting bits of the third input data and inputting the first input data, the second input data, and the shifted third input data to a 3-1 adder/subtractor.

8. The method of claim 5, comprising performing the identifying, selecting, and performing for a Viterbi algorithm.

9. An apparatus comprising:
pre-comparison circuitry to identify how a first result of a first operation compares to a second result of a second operation and to output data indicating how the first result compares to the second result; and
selection and operation performance circuitry to select the first result or the second result in response to the data indicating how the first result compares to the second result and to perform the first operation or the second operation to produce the selected result,
the pre-comparison circuitry to receive first input data, second input data, and third input data and to identify how a first result of a first operation on the first input data and the third input data compares to a second result of a second operation on the second input data and the third input data; and
the selection and operation performance circuitry to receive the first input data, the second input data, and the third input data and to perform the first operation on the first input data and the third input data or the second operation on the second input data and the third input data to produce the selected result.

10. The apparatus of claim 9, the pre-comparison circuitry to store the data indicating how the first result of the first operation compares to the second result of the second operation.

11. The apparatus of claim 9, the pre-comparison circuitry to shift bits of the third input data, wherein the pre-comparison circuitry comprises a 3-1 adder/subtractor to receive the first input data, the second input data, and the shifted third input data as inputs.

12. An apparatus comprising:
pre-comparison circuitry to identify how a first result of a first operation compares to a second result of a second operation without producing the first result or the second result and to output data indicating how the first result compares to the second result; and
selection and operation performance circuitry to perform the first operation to produce the first result and the second operation to produce the second result and to select the produced first result or the produced second result in response to the data indicating how the first result compares to the second result,
the pre-comparison circuitry to receive first input data, second input data, and third input data and to identify how a first result of a first operation on the first input data and the third input data compares to a second result of a second operation on the second input data and the third input data; and
the selection and operation performance circuitry to receive the first input data, the second input data, and the third input data and to perform the first operation on the first input data and the third input data to produce the first result and the second operation on the second input data and the third input data to produce the second result.

13. The apparatus of claim 12, the pre-comparison circuitry to store the data indicating how the first result of the first operation compares to the second result of the second operation.

14. The apparatus of claim 12, the pre-comparison circuitry to shift bits of the third input data, wherein the pre-comparison circuitry comprises a 3-1 adder/subtractor to receive the first input data, the second input data, and the shifted third input data as inputs.

15. A system comprising
(a) a coder/decoder to receive analog signals and convert the analog signals into corresponding input data; and
(b) a processor to process the corresponding input data, the processor comprising an execution unit comprising
(i) pre-comparison circuitry to receive first input data, second input data, and third input data, to identify how a first result of a first operation on the first input data and the third input data compares to a second result of a second operation on the second input data and the third input data, and to output data indicating how the first result compares to the second result,
(ii) selection and operation performance circuitry to receive the first input data, the second input data, and the third input data, to select the first result or the second result in response to the data indicating how the first result compares to the second result, and to perform the first operation on the first input data and the third input data or the second operation on the second input data and the third input data to produce the selected result, and (iii) control logic to control the pre-comparison circuitry and the selection and operation performance circuitry.

16. The system of claim 15, the pre-comparison circuitry to identify how a first result of a first operation compares to a second result of a second operation without producing the first result or the second result.

17. The system of claim 15, the pre-comparison circuitry to store the data indicating how the first result of the first operation compares to the second result of the second operation.

18. The system of claim 15, the pre-comparison circuitry to shift bits of the third input data, wherein the pre-comparison circuitry comprises a 3-1 adder/subtractor to receive the first input data, the second input data, and the shifted third input data as inputs.

19. The system of claim 15, the processor to perform a Viterbi algorithm on the corresponding input data.

20. A system comprising
   (a) a coder/decoder to receive analog signals and convert the analog signals into corresponding input data; and
   (b) a processor to process the corresponding input data, the processor comprising an execution unit comprising
      (i) pre-comparison circuitry to receive first input data, second input data, and third input data, to identify how a first result of a first operation on the first input data and the third input data compares to a second result of a second operation on the second input data and the third input data without producing the first result or the second result, and to output data indicating how the first result compares to the second result,
      (ii) selection and operation performance circuitry to receive the first input data, the second input data, and the third input data, to perform the first operation on the first input data and the third input data to produce the first result and the second operation on the second input data and the third input data to produce the second result, and to select the produced first result or the produced second result in response to the data indicating how the first result compares to the second result, and
      (iii) control logic to control the pre-comparison circuitry and the selection and operation performance circuitry.

21. The system of claim 20, the pre-comparison circuitry to store the data indicating how the first result of the first operation compares to the second result of the second operation.

22. The system of claim 20, the pre-comparison circuitry to shift bits of the third input data, wherein the pre-comparison circuitry comprises a 3-1 adder/subtractor to receive the first input data, the second input data, and the shifted third input data as inputs.

23. The system of claim 20, the processor to perform a Viterbi algorithm on the corresponding input data.

* * * * *